{# (12) United States Patent
Hayashi

(10) Patent No.: US 7,068,530 B2
(45) Date of Patent: Jun. 27, 2006

(54) MAGNETORESISTIVE EFFECT ELEMENT AND MEMORY DEVICE USING THE SAME

(75) Inventor: Katsuhiko Hayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 280 days.

(21) Appl. No.: 10/743,129

(22) Filed: Dec. 23, 2003

(65) Prior Publication Data

US 2005/0052903 A1 Mar. 10, 2005

(30) Foreign Application Priority Data

Dec. 27, 2002 (JP) .......... 2002-380720
Dec. 27, 2002 (JP) .......... 2002-380721

(51) Int. Cl.
*G11C 11/00* (2006.01)

(52) U.S. Cl. .......... 365/158; 365/243.5; 365/32

(58) Field of Classification Search .......... 365/158, 365/243.5, 154, 171, 32, 173, 232, 241
See application file for complete search history.

(56) References Cited

U.S. PATENT DOCUMENTS 6,005,800 A * 12/1999 Koch et al. .......... 365/173
6,215,301 B1 * 4/2001 Lenssen .......... 324/252
2002/0097598 A1 7/2002 Hoenigschmid

FOREIGN PATENT DOCUMENTS

JP 2002-249565 9/2002

* cited by examiner

*Primary Examiner*—Anh Phung
*Assistant Examiner*—Dang T. Nguyen
(74) *Attorney, Agent, or Firm*—Oblon, Spivak, McClelland, Maier & Neustadt, P.C.

(57) ABSTRACT

One block SB serving as a fundamental unit constituting a data reading circuit is constituted by four memory cells MS1 to MS4 connected electrically in series, four FETs S1 to S4 connected in parallel with the memory cells MS1 to MS4 in one-to-one correspondence, and an FET S0 connected to one of series connection ends of the memory cells MS1 to MS4. Each memory cell MS1–MS4 is formed out of a TMR element having two TMR element portions connected electrically in series. The two TMR element portions are connected in series to thereby form a series connection body. A sensing current flows in only through one end of the series connection body of the two TMR element portions, passes through the TMR element portions in turn, and then flows out only through the other end of the series connection body.

Further, the TMR element 11 has two TMR element portions 11A and 11B. The TMR element portions 11A and 11B are disposed in a direction parallel with their laminated surfaces with respect to each other. The TMR element portions 11A and 11B are electrically connected in series to thereby form a series connection body. A sensing current for detecting a change in magnetoresistance flows in only through one end of the series connection body of the two TMR element portions 11A and 11B, passes through the TMR element portions 11A and 11B in turn, and then flows out only through the other end of the series connection body. The sensing current flows through an effective area effective in changing the magnetoresistance in each TMR element portion 11A, 11B, and in a direction substantially perpendicular to the laminated surface.

44 Claims, 25 Drawing Sheets

}

MAGNETORESISTIVE EFFECT ELEMENT AND MEMORY DEVICE USING THE SAME

BACKGROUND OF THE INVENTION

The present invention relates to a magnetoresistive effect element and a memory device using the same.

Magnetoresistive effect elements are used for various applications, such as memory devices such as MRAM (Magnetic Random Access Memory), magnetic heads of hard disk drives (HDD), magnetic sensors, and so on. Of such magnetoresistive effect elements, TMR (Tunneling Magneto-Resistive effect) elements which are one kind of magnetoresistive effect elements each allowing a sensing current to flow in a direction perpendicular to the laminated surface of the TMR element have come to be used for various applications because of their high MR (Magneto-Resistance) ratio.

On the other hand, MRAM is nonvolatile and capable of solving the volatility which is one of drawbacks of DRAM (Dynamic Random Access Memory) used heretofore. Thus, researches on MRAM have been advanced.

Here, two examples of MRAMs using TMR elements in the background art will be described with reference to the drawings.

First, a first conventional example will be described with reference to FIG. 39. FIG. 39 is a schematic sectional view showing the vicinity of one memory cell of an MRAM in the first conventional example. The MRAM has a plurality of upper conductor wires 1 and a plurality of lower conductor wires 2. The upper conductor wires 1 are disposed at intervals in the direction perpendicular to the paper of FIG. 39 so as to extend in the left/right direction in FIG. 39. The lower conductor wires 2 are disposed at intervals in the left/right direction in FIG. 39 so as to extend in the direction perpendicular to the paper of FIG. 39. TMR elements 3 are disposed as memory cells at the crossing points of the wires 1 and 2 respectively. Each TMR element 3 is constituted by a tunnel barrier layer 4 made from an insulating layer, two magnetic layers 5 and 6 having the tunnel barrier layer 4 put therebetween, and a pin layer 7 made from an antiferromagnetic layer. The direction of magnetization of the lower magnetic layer 6 is fixed by the pin layer 7 so that the magnetic layer 6 serves as a pinned layer. On the other hand, the upper magnetic layer 5 serves as a free layer whose magnetization direction is variable in accordance with an external magnetic field. The upper magnetic layer 5 is electrically connected to the corresponding upper conductor wire 1, and the pin layer 7 is electrically connected to the corresponding lower conductor wire 2.

In this first conventional example, each memory cell is constituted by one TMR element 3. Then, each TMR element 3 has only one overlapping area (tunnel junction area) of the tunnel barrier layer 4 with the two magnetic layers having the tunnel barrier layer 4 put therebetween.

When data is written into the TMR element 3, the direction of magnetization in the free layer 5 is established by a combined current magnetic field of magnetic fields generated by currents applied to the upper conductor wire 1 and the lower conductor wire 2 connected to the TMR element 3. When the direction of one of the currents applied to the wires 1 and 2 is changed, the direction of magnetization in the free layer 5 can be switched between parallelism and antiparallelism to the direction of magnetization in the pinned layer 6.

The TMR element 3 has the property that the resistance value of a current flowing from one of the magnetic layers 5 and 6 to the other thereof through the tunnel barrier layer 4 becomes low (R) when the directions of magnetization in the magnetic layers 5 and 6 are parallel (identical), while the resistance value becomes high (R+ΔR) when the directions of magnetization are antiparallel. Accordingly, a set of data "0" and "1" (or the reverse of them) can be stored correspondingly to resistance values R and R+ΔR respectively. Incidentally, the ratio ΔR/R in this event is the MR radio of the TMR element 3. When data is read out, a current (sensing current) is allowed to flow in the course from the upper wire layer 1 to the lower wire layer 2 through the respective layers 5, 4, 6 and 7 (or in the reverse course). The magnitude of the resistance value is detected based on this current, so as to read the data written in the TMR element 3.

As is understood from the above description, not only when data is written but also when data is read, one of the plurality of upper conductor wires 1 is selected and one of the plurality of lower conductor wires 2 is selected. Thus, a specific TMR element 3 (memory cell) is selected, and data is written/read into/from the selected TMR element 3.

Incidentally, a layer 8 includes circuit element constituent parts, wiring and so on for forming circuits for performing writing and reading thus, together with a semiconductor substrate 9. The details of the layer 8 are not shown in FIG. 39. The TMR elements 3 and the conductor wires 1 and 2 are formed on the semiconductor substrate 9 and the layer 8. The semiconductor substrate 9 and the layer 8 correspond to a so-called IC substrate as a whole.

MRAM corresponding to the first conventional example described above is disclosed in Patent Document 1.

Next, MRAM according to a second conventional example will be described with reference to FIGS. 40 and 41. FIG. 40 is a circuit diagram showing a reading circuit of the MRAM according to the second conventional example. FIG. 41 is a sectional view showing the structure of the reading circuit. This second conventional example shows the MRAM disclosed in Patent Document 2. In this MRAM 100, one TMR element is used as each memory cell. TMR elements (magnetic laminates each having a tunnel junction) MS0 to MS3 are electrically connected in series, and transistors X0 to X3 are electrically connected to the TMR elements MS0 to MS3 through vias VU1, VL1, VU2, VL2 and VU3 respectively. One end of the series connection of the TMR elements MS0 to MS3 is connected to a bit line BL through a switch S1, and the other end thereof is grounded. Incidentally, in FIG. 41, the reference numerals 108, 110, 112, 114, 116 and 118 represent source/drain regions (+n regions) for forming the switch S1 and the transistors X3 to X1, and the signs PC represent gates for forming the switch S1 and the transistors X3 to X1. In addition, the reference numerals 120, 122, 124, 126 and 128 represent metal plates.

The principle of reading/writing data in this second conventional example is fundamentally similar to that in the first conventional example. In the second conventional example, however, writing data is performed by use of a combined current magnetic field between a bit line BL disposed above the TMR elements MS0 to MS3 so as to be shared among the TMR elements MS0 to MS3 and a word line WL selected from word lines WL provided under the TMR elements MS0 to MS3 in one-to-one correspondence. On the other hand, reading data is performed as follows. That is, only one of the transistors X0 to X3 is turned off selectively while the other transistors are turned on. Then, the switch S1 is turned on so that the TMR element corresponding to the transistor turned off selectively is selected. Reading data is performed based on a current outputted from the selected TMR element.

In the second conventional example, each memory cell is constituted by one TMR element in the same manner as in the first conventional example. In addition, each TMR element has only one overlapping area (tunnel junction area) of the tunnel barrier layer with the two magnetic layers having the tunnel barrier layer put therebetween.

The second conventional example is superior to the first conventional example in terms of increase in memory capacity. That is, the structure of a memory device according to the first conventional example is generally called an NOR circuit, which is regarded as a circuit configuration suitable for high-speed memory operation. However, such a structure has a drawback in complicated wiring. Thus, the structure is not suitable for increasing in memory capacity. A large number of address control lines are required for designating an individual address. Thus, there is a drawback that the way to designate the address is complicated. On the other hand, the second conventional example adopts the circuit configuration for the reading circuit. The circuit is referred to as a so-called NAND circuit. Accordingly, due to the drain/source shared among the transistors X0 to X3, it is not necessary to provide wiring of a special conductor pattern as the wiring among the transistors. Thus, the density in transistor arrangement can be improved, and hence the memory capacity can be increased.

[Patent Document 1] Japanese Patent Laid-Open No. 2002-249565

[Patent Document 2] U.S. Patent Application Publication No. 2002/0097598

However, in a general TMR element as adopted in the first and second conventional examples, there is a drawback that the MR ratio obtained actually is reduced due to the voltage bias characteristic possessed by the TMR element. This drawback will be described.

To read data or perform another magnetic detection in a TMR element, it is necessary to allow a sensing current to flow between two magnetic layers (two magnetic layers having a tunnel barrier layer put therebetween) of the TMR element. Therefore, a voltage is applied between the two magnetic layers so as to allow the current to flow therebetween. However, the rate of change in magnetic resistance (MR ratio $\Delta R/R$) of the TMR element is generally not so high, that is, not higher than 50%. In addition, the TMR element has the characteristic (voltage bias characteristic) that the MR ratio is reduced with the increase of the voltage applied to allow a current to flow in the laminated direction of the TMR element. Though the change of the MR ratio depends on the configuration of the TMR element, for example, the MR ratio becomes approximately not higher than half of the aforementioned value when the voltage applied is increased to about 0.5 V.

Thus, in the first and second conventional examples, the S/N ratio of a read signal is lowered so that the reliability in reading data cannot be always enhanced satisfactorily.

Improvement in MR ratio is the most important problem not only when TMR elements are used in an MRAM but also when TMR elements are used in a magnetic head, a magnetic sensor or the like.

In addition, in the second conventional example, it is essential to electrically connect both the input and output terminals (where a sensing current flows in and out) of each TMR element to the substrate side when an NAND circuit is adopted as a reading circuit. In the second conventional example, the substrate-side end portions of the TMR elements MS0 to MS3 are connected to the substrate through the vias VL1 and VL2 while the other end portions of the TMR elements MS0 to MS3 opposite to the substrate are connected to the substrate through the vias VU1, VU2 and VU3. However, since a sensing current must be allowed to flow into the tunnel junction area of each TMR element perpendicularly to the laminated surface of the TMR element, it is inevitable to leave one end portion of the TMR element MS0–MS3 at a distance from the substrate relatively to the other end portion. Thus, in comparison with the vias VL1 and VL2, the vias VU1, VU2 and VU3 have to be formed to be higher in height so as to extend over a larger number of layers. However, it is difficult in a manufacturing process to form each via extending over a large number of layers.

As described above, the second conventional example is indeed suitable for increasing the memory capacity, but it is not possible to make the manufacturing process easy.

Although description has been made here on the second conventional example, also in various applications using magnetoresistive effect elements each allowing a sensing current to flow perpendicularly to the laminated surface of the magnetoresistive effect element, it is often necessary to connect the input and output terminals of each magnetoresistive effect element to the substrate side. In such a case, the manufacturing process cannot be made easy for the same reason as in the second conventional example.

SUMMARY OF THE INVENTION

The invention was developed in consideration of such circumstances. It is an object of the invention to provide a magnetoresistive effect element in which the lowering of the MR ratio caused by the voltage bias characteristic can be improved, and a memory device using the magnetoresistive effect element.

It is another object of the invention to provide a magnetoresistive effect element in which the manufacturing process involved in electric connections of input and output terminals of the magnetoresistive effect element can be made easy, and a memory device using the magnetoresistive effect element.

It is further another object of the invention to provide a memory device in which the memory capacity can be increased, the reliability in reading data can be enhanced, and the manufacturing process involved in electric connections of input and output terminals of each magnetoresistive effect element can be made easy.

In order to solve the foregoing problems, according to a first configuration of the invention, there is provided a memory device including: a plurality of memory cells connected electrically in series, and a plurality of switching elements connected in parallel with the memory cells in one-to-one correspondence; wherein each of the memory cells is comprised of a magnetoresistive effect element having a plurality of magnetoresistive effect element portions; wherein the magnetoresistive effect elements are laminated on one surface side of a substrate and disposed in a direction parallel to laminated surfaces of the magnetoresistive effect elements with respect to one another; wherein the magnetoresistive effect element portions in each of the magnetoresistive effect elements are electrically connected in series so as to form an electric series connection body; wherein opposite ends of the series connection body in each of the magnetoresistive effect-elements are electrically connected to a sensing current supply portion so that a sensing current for detecting a change in magnetoresistance flows in through one end of the series connection body, passes in turn through effective areas effective in changing magnetoresistance in each of the magnetoresistive effect element portions so as to penetrate the laminated surfaces, and flows out through the other end of the series connection body; and wherein each of the switching elements switches on/off between the one end and the other end of the series connection body of the magnetoresistive effect element connected in parallel with the switching element, in accordance with a signal inputted into a control input portion of the switching element.

This first configuration adopts a so-called NAND circuit having a plurality of memory cells connected electrically in series and a plurality of switching elements connected in parallel with the memory cells in one-to-one correspondence. Accordingly, the memory capacity can be increased.

In each of the magnetoresistive effect elements, the plurality of magnetoresistive effect element portions correspond to general magnetoresistive effect elements in the background art individually, and are connected in series. Thus, a voltage applied to the magnetoresistive effect element is divided into partial voltages, which are applied to the magnetoresistive effect element portions respectively. As a result, the voltages applied to the magnetoresistive effect element portions respectively are reduced. Accordingly, in each of the magnetoresistive effect elements, the lowering of the MR ratio caused by the voltage bias characteristic is relieved so that the MR ratio is improved. According to the first configuration, therefore, the reliability in reading data is enhanced.

As another method for connecting individual magnetoresistive effect element portions in series, it can be also considered to stack a plurality of magnetoresistive effect element portions. In this case, however, the process for forming an individual magnetoresistive effect element portion into a film must be repeated as many times as the number of magnetoresistive effect element portions to be formed when the magnetoresistive effect element is manufactured. Therefore, a considerable number of steps are required for manufacturing, and the yield ratio deteriorates so that the cost increases. For example, when each magnetoresistive effect element portion is a TMR element portion, a tunnel barrier layer in the TMR element portion is too thin to obtain desired properties due to a slight difference in manufacturing conditions. It is therefore considerably difficult to form the tunnel barrier layer into a film. When such a process for forming a tunnel barrier layer has to be repeated a plurality of times, manufacturing will become considerably difficult, and it will be inevitable that the yield ratio will be lowered on a large scale.

On the other hand, according to the first configuration, the plurality of magnetoresistive effect element portions are disposed in parallel with their laminated surfaces with respect to one another. Thus, the layers of the magnetoresistive effect element portions can be formed into films together in a lump so that the manufacturing becomes easy without reduction in yield ratio.

According to a second configuration of the invention, there is provided a memory device including: a plurality of blocks arrayed; wherein each of the blocks includes a plurality of memory cells connected electrically in series, and a plurality of switching elements connected in parallel with the memory cells in one-to-one correspondence; wherein each of the memory cells is comprised of a magnetoresistive effect element having a plurality of magnetoresistive effect element portions; wherein the magnetoresistive effect elements are laminated on one surface side of a substrate and disposed in a direction parallel to laminated surfaces of the magnetoresistive effect elements with respect to one another; wherein the magnetoresistive effect element portions in each of the magnetoresistive effect elements are electrically connected in series so as to form an electric series connection body; wherein opposite ends of the series connection body in each of the magnetoresistive effect elements are electrically connected to a sensing current supply portion so that a sensing current for detecting a change in magnetoresistance flows in through one end of the series connection body, passes in turn through effective areas effective in changing magnetoresistance in each of the magnetoresistive effect element portions so as to penetrate the laminated surfaces, and flows out through the other end of the series connection body; and wherein each of the switching elements switches on/off between the one end and the other end of the series connection body of the magnetoresistive effect element connected in parallel with the switching element, in accordance with a signal inputted into a control input portion of the switching element.

This second configuration adopts a block configuration. Accordingly, an NAND circuit can be adopted to increase the memory capacity, while high-speed random access can be obtained.

According to a third configuration of the invention, there is provided a memory device defined in the second configuration; wherein the plurality of blocks are arrayed in a two-dimensional matrix extending in a row direction and in a column direction, while the plurality of memory cells in each of the blocks are arrayed in the column direction; wherein the control input portions of the plurality of switching elements in the plurality of blocks are connected through a plurality of first read solution lines in respective rows so that each of the first read selection lines is shared among the control input portions in a row corresponding to the first read selection line; wherein each of the blocks includes a selection switch connected to one of series connection ends of the plurality of memory cells in the block; wherein the other ends of series connections of the plurality of memory cells in the plurality of blocks are connected through a plurality of read lines in respective columns so that each of said read lines is shared among the other ends in a column corresponding to the read line; and wherein control input portions of the selection switches in the plurality of blocks are connected through a plurality of second read selection lines in respective columns so that each of said second read selection lines is shared among the control input portions in a column corresponding to the second read section line.

This third configuration is a specific example of a block configuration by which high-speed random access can be attained.

According to a fourth configuration of the invention, there is provided a memory device defined in the first configuration, wherein each of the switching elements is a field effect transistor.

According to this fourth configuration, an NAND circuit can be obtained with a drain/source shared among the field effect transistors. It is therefore unnecessary to provide wiring of a special conductor pattern as the wiring among the transistors. Thus, the configuration density of the transistors can be improved, and hence the memory capacity can be increased.

According to a fifth configuration of the invention, there is provided a memory device defined in the first configuration, wherein the magnetoresistive effect element portions in each of the magnetoresistive effect elements have one and the same layer structure.

According to this fifth configuration, since the magnetoresistive effect element portions have one and the same layer structure, the layers of the magnetoresistive effect element portions can be formed into films together in a lump. Thus, manufacturing becomes easy.

According to a sixth configuration of the invention, there is provided a memory device defined in the first configuration, wherein in each of the magnetoresistive effect elements, a direction of the sensing current flowing through the effective area of one of paired magnetoresistive effect element portions selected from the plurality of magnetoresistive effect element portions and connected electrically with each other is opposite to a direction of the sensing current flowing through the effective area of the other of the paired magnetoresistive effect element portions.

In the first to fifth configurations, the sensing current can flow in one and the same direction through the paired magnetoresistive effect element portions. However, when the direction of the sensing current flowing through one of the paired magnetoresistive effect element portions is made opposite to the direction of the sensing current flowing through the other of the paired magnetoresistive effect element portions as in the sixth configuration, the paired magnetoresistive effect element portions maybe connected electrically on the same side. Thus, the sixth configuration is preferred because electric connection for connecting a plurality of magnetoresistive effect element portions in series can be performed easily.

According to a seventh configuration of the invention, there is provided a memory device defined in the first configuration, wherein in each of the magnetoresistive effect elements, a pair of magnetoresistive effect element portions selected from the plurality of magnetoresistive effect element portions are connected electrically with each other by forming at least one of layers constituting one of the paired magnetoresistive effect element portions and a corresponding one of layers constituting the other of the paired magnetoresistive effect element portions integrally out of one and the same material.

It is preferred to adopt such a structure according to the seventh configuration because electric connection for connecting a plurality of magnetoresistive effect element portions in series can be performed easily.

According to an eighth configuration of the invention, there is provided a memory device defined in the first configuration, wherein in each of the magnetoresistive effect elements, the number of the plurality of magnetoresistive effect element portions is even.

According to this eighth configuration, the input and output terminals (one end and the other end of the series connection body) of each magnetoresistive effect element can be disposed on one and the same side because the number of the plurality of magnetoresistive effect element portions in the magnetoresistive effect element is even. Accordingly, when the input and output terminals of the magnetoresistive effect element have to be connected electrically on the same side, the manufacturing process involved in electric connections of the input and output terminals of the magnetoresistive effect element can be made easy.

According to a ninth configuration of the invention, there is provided a memory device defined in the eighth configuration; wherein in each of the magnetoresistive effect elements, the one end of the series connection body is a layer of one of the magnetoresistive effect element portions, which layer is on the substrate side; and wherein in each of the magnetoresistive effect elements, the other end of the series connection body is a layer of another of the magnetoresistive effect element portions, which layer is on the substrate side.

According to this ninth configuration, both the input and output terminals (one end and the other end of the series connection body) of the magnetoresistive effect element are located on the substrate side. Accordingly, when both the input and output terminals of the magnetoresistive effect element must be connected electrically on the substrate side, the manufacturing process involved in electric connections of the input and output terminals of the magnetoresistive effect element can be made easy.

According to a tenth configuration of the invention, there is provided a memory device defined in the first configuration, wherein in each of the magnetoresistive effect elements, each of the magnetoresistive effect element portions includes first and second magnetic layers.

According to an eleventh configuration of the invention, there is provided a memory device defined in the tenth configuration, wherein in each of the magnetoresistive effect elements, each of the magnetoresistive effect element portions includes a tunnel barrier layer put between the first and second magnetic layers. This eleventh configuration is an example in which each of the magnetoresistive effect element portions is formed as a TMR element portion.

According to a twelfth configuration of the invention, there is provided a memory device defined in the tenth configuration, wherein in each of the magnetoresistive effect elements, each of the magnetoresistive effect element portions includes a nonmagnetic metal layer put between the first and second magnetic layers. This twelfth configuration is an example in which each of the magnetoresistive effect element portions is formed as a GMR (Giant Magneto-Resistive) element portion allowing a sensing current to flow substantially perpendicularly to the laminated surface of the GMR element portion.

According to a thirteenth configuration of the invention, there is provided a memory device defined in the tenth configuration, wherein in each of the magnetoresistive effect elements, at least a pair of magnetoresistive effect element portions selected from the plurality of magnetoresistive effect element portions are connected electrically with each other by forming the first magnetic layer of one of the paired magnetoresistive effect element portions and the first magnetic layer of the other of the paired magnetoresistive effect element portions integrally out of one and the same material. It is preferable to adopt such a structure according to the thirteenth configuration because electric connection for connecting a plurality of magnetoresistive effect element portions in series can be performed easily.

According to a fourteenth configuration of the invention, there is provided a memory device defined in the tenth configuration, wherein in each of the magnetoresistive effect elements, at least a pair of magnetoresistive effect element portions selected from the plurality of magnetoresistive effect element portions are connected electrically with each other by forming the second magnetic layer of one of the paired magnetoresistive effect element portions and the second magnetic layer of the other of the paired magnetoresistive effect element portions integrally out of one and the same material.

It is preferable to adopt such a structure according to the fourteenth configuration because electric connection for connecting a plurality of magnetoresistive effect element portions in series can be performed easily.

According to a fifteenth configuration of the invention, there is provided a memory device defined in the tenth configuration, wherein in each of the magnetoresistive effect elements, the first magnetic layer of each of the magnetoresistive effect element portions is a free layer whose magnetization direction is variable in accordance with an external magnetic field, while the second magnetic layer of each of the magnetoresistive effect element portions is a pinned layer whose magnetization direction is fixed in a constant direction.

The first and second magnetic layers are generally formed as a free layer and a pinned layer as in this fifteenth configuration. However, the seventh to eleventh configurations are not limited to such a mode.

According to a sixteenth configuration of the invention, there is provided a memory device defined in the fifteenth configuration, wherein in each of the magnetoresistive effect elements, magnetization directions of the second magnetic layers of the plurality of magnetoresistive effect element portions are identical. According to this sixteenth configuration, the magnetization directions of the second magnetic layers of the plurality of magnetoresistive effect element portions are identical. It is therefore possible to actuate the magnetoresistive effect element portions properly when an external magnetic field acts on their free layers: equally.

According to a seventeenth configuration of the invention, there is provided a memory device defined in the fifteenth configuration, wherein in each of the magnetoresistive effect elements, the first magnetic layer of each of the magnetoresistive effect element portions is disposed on the opposite side of the second magnetic layer to the substrate.

This seventeenth configuration is preferred because the free layer of each magnetoresistive effect element portion receives an external magnetic field sensitively when the external magnetic field acts on the free layer of the magnetoresistive effect element portion on the opposite side to the substrate.

According to an eighteenth configuration of the invention, there is provided a memory device defined in the first configuration; wherein two write lines are disposed for giving a magnetic field to each of the magnetoresistive effect elements so as to change over a magnetization state of the plurality of magnetoresistive effect element portions in the magnetoresistive effect element between a first state where all the resistance values of the plurality of magnetoresistive effect element portions become relatively large and a second state where all the resistance values of the plurality of magnetoresistive effect element portions become relatively small; and wherein the magnetization state of the plurality of magnetoresistive effect element portions in the magnetoresistive effect element is changed over in a lump by a combined magnetic field generated by the two write lines.

According to this eighteenth configuration, the change in magnetoresistance of the total of the plurality of magnetoresistive effect element portions increases because the magnetization state can be changed over between the first state and the second state. Thus, the reliability in reading data is further enhanced.

According to a nineteenth configuration of the invention, there is provided a memory device defined in the seventeenth configuration; wherein two write lines are disposed for giving a magnetic field to each of the magnetoresistive effect elements so as to change over a magnetization state of the plurality of magnetoresistive effect element portions in the magnetoresistive effect element between a first state where all the resistance values of the plurality of magnetoresistive effect element portions become relatively large and a second state where all the resistance values of the plurality of magnetoresistive effect element portions become relatively small; wherein the magnetization state of the plurality of magnetoresistive effect element portions in the magnetoresistive effect element is changed over in a lump by a combined magnetic field generated by the two write lines; and wherein a magnetic circuit forming layer is provided in the magnetoresistive effect element for guiding the magnetic field generated by the two write lines into the free layers.

According to this nineteenth configuration, a magnetic field generated by the write lines is applied to the free layers through the magnetic circuit forming layer efficiently. It is therefore possible to limit the current to be supplied to the write lines. Thus, the sectional areas of the write lines can be reduced so that the memory capacity can be increased, while the current consumption can be reduced. In addition, the magnetic circuit forming layer also operates as a magnetic shield. It is therefore possible to reduce magnetic influence of memory cells on each other when data is written.

According to a twentieth configuration of the invention, there is provided a memory device defined in the nineteenth configuration; wherein the two write lines disposed for each of the magnetoresistive effect elements extend in different directions from each other and in parallel with the laminated surfaces so as to cross each other; and wherein the magnetic circuit forming layer provided for each of the magnetoresistive effect elements guides the combined magnetic field generated by the two write lines disposed for the magnetoresistive effect element, into the free layers of the magnetoresistive effect element in the vicinities of four corners of a crossing portion of the two write lines.

According to this twentieth configuration, a magnetic field required essentially for writing is applied to the free layers efficiently because the magnetic circuit forming layer guides a combined magnetic field into the free layers in the vicinities of the four corners of the crossing portion.

According to a twenty-first configuration of the invention, there is provided a memory device defined in the eighteenth configuration, wherein the two write lines disposed for each of the magnetoresistive effect elements are electrically insulated from each other.

According to this twenty-first configuration, a current for writing can be supplied to a desired memory cell stably because the write lines are electrically insulated from each other.

According to a twenty-second configuration of the invention, there is provided a memory device defined in the eighteenth configuration, wherein the two write lines disposed for each of the magnetoresistive effect elements are disposed on the opposite side of the magnetoresistive effect element to the substrate.

In order to solve the foregoing problems, according to a twenty-third configuration of the invention, there is provided a magnetoresistive effect element including a plurality of magnetoresistive effect element portions laminated on one surface side of a substrate and disposed in a direction parallel to laminated surfaces of the magnetoresistive effect element portions with respect to one another; wherein the magnetoresistive effect element portions are electrically connected in series so as to form an electric series connection body; and wherein opposite ends of the series connection body are electrically connected to a sensing current supply portion so that a sensing current for detecting a change in magnetoresistance flows in through one end of the series connection body, passes in turn through effective areas effective in changing magnetoresistance in each of the magnetoresistive effect element portions so as to penetrate the laminated surfaces, and flows out through the other end of the series connection body.

In this twenty-third configuration, the plurality of magnetoresistive effect element portions correspond to general magnetoresistive effect elements in the background art individually, and are connected in series. Thus, a voltage applied to the magnetoresistive effect element is divided into partial voltages, which are applied to the magnetoresistive effect element portions respectively. As a result, the voltages applied to the magnetoresistive effect element portions respectively are reduced. Accordingly, the lowering of the MR ratio caused by the voltage bias characteristic is relieved so that the MR ratio is improved.

As another method for connecting individual magnetoresistive effect element portions in series, it can be also considered to stack a plurality of magnetoresistive effect element portions. In this case, however, the process for forming an individual magnetoresistive effect element portion into a film must be repeated as many times as the number of magnetoresistive effect element portions to be formed when the magnetoresistive effect element is manufactured. Therefore, a considerable number of steps are required for manufacturing, and the yield ratio deteriorates so that the cost increases. For example, when each magnetoresistive effect element portion is a TMR element portion, a tunnel barrier layer in the TMR element portion is too thin to obtain desired properties due to a slight difference in manufacturing conditions. It is therefore considerably difficult to form the tunnel barrier layer into a film. When such a process for forming a tunnel barrier layer has to be repeated a plurality of times, manufacturing will become considerably difficult, and it will be inevitable that the yield ratio will be lowered on a large scale.

On the other hand, according to the twenty-third configuration, the plurality of magnetoresistive effect element portions are disposed in parallel with their laminated surfaces with respect to one another. Thus, the layers of the magnetoresistive effect element portions can be formed into films together in a lump so that the manufacturing becomes easy without reduction in yield ratio.

According to a twenty-fourth configuration of the invention, there is provided a magnetoresistive effect element defined in the twenty-third configuration, wherein the magnetoresistive effect element portions have one and the same layer structure.

According to this twenty-fourth configuration, since the magnetoresistive effect element portions have one and the same layer structure, the layers of the magnetoresistive effect element portions can be formed into films together in a lump. Thus, manufacturing becomes easy.

According to a twenty-fifth configuration of the invention, there is provided a magnetoresistive effect element defined in the twenty-third configuration, wherein a direction of the sensing current flowing through the effective area of one of paired magnetoresistive effect element portions which are selected from the plurality of magnetoresistive effect element portions and which are connected electrically with each other is opposite to a direction of the sensing current flowing through the effective area of the other of the paired magnetoresistive effect element portions.

In the twenty-third and twenty-fourth configurations, the sensing current can be made to flow in one and the same direction through the paired magnetoresistive effect element portions. However, when the sensing current is made to flow in the opposite directions as in the twenty-fifth configuration, the paired magnetoresistive effect element portions may be electrically connected with each other on one and the same side. Thus, the twenty-fifth configuration is preferred because electric connection for connecting a plurality of magnetoresistive effect element portions in series can be performed easily.

According to a twenty-sixth configuration of the invention, there is provided a magnetoresistive effect element defined in the twenty-third configuration, wherein a pair of magnetoresistive effect element portions selected from the plurality of magnetoresistive effect element portions are connected electrically with each other by forming at least one of layers constituting one of the paired magnetoresistive effect element portions and a corresponding one of layers constituting the other of the paired magnetoresistive effect element portions integrally out of one and the same material.

It is preferred to adopt such a structure according to the twenty-sixth configuration because electric connection for connecting a plurality of magnetoresistive effect element portions in series can be performed easily.

According to a twenty-seventh configuration of the invention, there is provided a magnetoresistive effect element defined in the twenty-third configuration, wherein the number of the plurality of magnetoresistive effect element portions is even.

According to this twenty-seventh configuration, the input and output terminals (one end and the other end of the series connection body) of the magnetoresistive effect element can be disposed on one and the same side because the number of the plurality of magnetoresistive effect element portions is even. Accordingly, when the input and output terminals of the magnetoresistive effect element have to be connected electrically on the same side, the manufacturing process involved in electric connections of the input and output terminals of the magnetoresistive effect element can be made easy.

According to a twenty-eighth configuration of the invention, there is provided a magnetoresistive effect element defined in the twenty-seventh configuration, wherein the one end of the series connection body is a layer of one of the magnetoresistive effect element portions, which layer is on the substrate side, and wherein the other end of the series connection body is a layer of another of the magnetoresistive effect element portions, which layer is on the substrate side.

According to this twenty-eighth configuration, both the input and output terminals (one end and the other end of the series connection body) of the magnetoresistive effect element are located on the substrate side. Accordingly, when both the input and output terminals of the magnetoresistive effect element must be connected electrically on the substrate side, the manufacturing process involved in electric connections of the input and output terminals of the magnetoresistive effect element can be made easy.

According to a twenty-ninth configuration of the invention, there is provided a magnetoresistive effect element defined in the twenty-third configuration, wherein each of the magnetoresistive effect element portions includes first and second magnetic layers.

According to a thirtieth configuration of the invention, there is provided a magnetoresistive effect element defined in the twenty-ninth configuration, wherein each of the magnetoresistive effect element portions includes a tunnel barrier layer put between the first and second magnetic layers. This thirtieth configuration is an example in which each of the magnetoresistive effect element portions is formed as a TMR element portion.

According to a thirty-first configuration of the invention, there is provided a magnetoresistive effect element defined in the twenty-ninth configuration, wherein each of the magnetoresistive effect element portions includes a nonmagnetic metal layer put between the first and second magnetic layers. This thirty-first configuration is an example in which each of the magnetoresistive effect element portions is formed as a GMR (Giant Magneto-Resistive) element portion in which a sensing current is made to flow substantially perpendicularly to the laminated surface of the GMR element portion.

According to a thirty-second configuration of the insertion, there is provided a magnetoresistive effect element defined in the twenty-ninth configuration, wherein at least a pair of magnetoresistive effect element portions selected from the plurality of magnetoresistive effect element portions are connected electrically with each other by forming the first magnetic layer of one of the paired magnetoresistive effect element portions and the first magnetic layer of the other of the paired magnetoresistive effect element portions integrally out of one and the same material.

It is preferable to adopt such a structure according to the thirty-second configuration because electric connection for connecting a plurality of magnetoresistive effect element portions in series can be performed easily.

According to a thirty-third configuration of the invention, there is provided a magnetoresistive effect element defined in the twenty-ninth configuration, wherein at least a pair of magnetoresistive effect element portions selected from the plurality of magnetoresistive effect element portions are connected electrically with each other by forming the second magnetic layer of one of the paired magnetoresistive effect element portions and the second magnetic layer of the other of the paired magnetoresistive effect element portions integrally out of one and the same material.

It is preferable to adopt such a structure according to the thirty-third configuration because electric connection for connecting a plurality of magnetoresistive effect element portions in series can be performed easily.

According to a thirty-fourth configuration of the invention, there is provided a magnetoresistive effect element defined in the twenty-ninth configuration, wherein the first magnetic layer of each of the magnetoresistive effect element portions is a free layer whose magnetization direction is variable in accordance with an external magnetic field, while the second magnetic layer of each of the magnetoresistive effect element portions is a pinned layer whose magnetization direction is fixed in a constant direction.

The first and second magnetic layers are generally formed as a free layer and a pinned layer as in this thirty-fourth configuration. However, the twenty-ninth to thirty-third configurations are not limited to such a mode.

According to a thirty-fifth configuration of the invention, there is provided a magnetoresistive effect element defined in the thirty-fourth configuration, wherein magnetization directions of the second magnetic layers of the plurality of magnetoresistive effect element portions are identical.

According to this thirty-fifth configuration, the magnetization directions of the second magnetic layers of the plurality of magnetoresistive effect element portions are identical. It is therefore possible to actuate the magnetoresistive effect element portions properly when an external magnetic field acts on their free layers equally.

According to a thirty-sixth configuration of the invention, there is provided a magnetoresistive effect element defined in the thirty-fourth configuration, wherein the first magnetic layer in each of the magnetoresistive effect element portions is disposed on the opposite side of the second magnetic layer to the substrate.

This thirty-sixth configuration is preferred because the free layer of each magnetoresistive effect element portion receives an external magnetic field sensitively when the external magnetic field acts on the free layer of the magnetoresistive effect element portion on the opposite side to the substrate.

According to a thirty-seventh configuration of the invention, there is provided a magnetoresistive effect element defined in the thirty-fourth configuration, wherein the first magnetic layer of each of the magnetoresistive effect element portions is made from a soft magnetic material.

When the free layer is made from a soft magnetic material as in the thirty-seventh configuration, the magnetization direction of the free layer becomes easy to have an analog change in accordance with the magnitude of an external magnetic field. Thus, the magnetoresistive effect element according to the thirty-seventh configuration is optimal for use in a magnetic sensor or the like. However, in the thirty-fourth to thirty-sixth configurations, the free layer may be made from a relatively hard magnetic material.

A memory device according to a thirty-eighth configuration of the invention includes a memory cell for storing data, the memory cell including a magnetoresistive effect element according to the twenty-third configuration.

According to this thirty-eighth configuration, the lowering of the MR ratio caused by the voltage bias characteristic of the magnetoresistive effect element is relieved so that the MR ratio is improved. Thus, the S/N ratio of a read signal is improved. As a result, the reliability in reading data is enhanced.

According to a thirty-ninth configuration of the invention, there is provided a memory device defined in the thirty-eighth configuration and further including one or more write lines for providing a magnetic field for changing over a magnetization state of the plurality of magnetoresistive effect element portions in the magnetoresistive effect element between a first state where all the resistance values of the plurality of magnetoresistive effect element portions become relatively large and a second state where all the resistance values of the plurality of magnetoresistive effect element portions become relatively small.

According to this thirty-ninth configuration, the change in magnetoresistance of the total of the plurality of magnetoresistive effect element portions increases because the magnetization state can be changed over between the first state and the second state. Thus, the reliability in reading data is further enhanced.

According to a fortieth configuration of the invention, there is provided a memory device defined in the thirty-ninth configuration; wherein the number of the one or more write lines is two; and wherein the magnetization state of the plurality of magnetoresistive effect element portions in the magnetoresistive effect element is changed over in a lump by a combined magnetic field generated by the two write lines.

According to this fortieth configuration, the magnetization state of the plurality of magnetoresistive effect element portions can be changed over in a lump by the two write lines. Thus, the fortieth configuration is preferred because the number of write lines can be suppressed even when the memory cells are disposed in a matrix.

According to a forty-first configuration of the invention, there is provided a memory device including: a memory cell for storing data, the memory cell including a magnetoresistive effect element defined in the thirty-sixth configuration; one or more write lines or providing a magnetic field for changing over a magnetization state of the plurality of magnetoresistive effect element portions in the magnetoresistive effect element between a first state where all the resistance values of the plurality of magnetoresistive effect element portions become relatively large and a second state where all the resistance values of the plurality of magnetoresistive effect element portions become relatively small; and a magnetic circuit forming layer for guiding the magnetic field generated by the one or more write lines, into the free layers.

According to this forty-first configuration, a magnetic field generated by the write lines is applied to the free layers through the magnetic circuit forming layer efficiently. It is therefore possible to limit the current to be supplied to the write lines. Thus, the sectional areas of the write lines can be reduced, so that the memory capacity can be increased while the current consumption can be reduced. In addition, the magnetic circuit forming layer also operates as a magnetic shield. It is therefore possible to reduce magnetic influence of memory cells on each other when data is written.

According to a forty-second configuration of the invention, there is provided a memory device defined in the forty-first configuration; wherein the number of the one or more write lines is two; wherein the magnetization state of the plurality of magnetoresistive effect element portions in the magnetoresistive effect element is changed over in a lump by a combined magnetic field generated by the two write lines; wherein the two write lines extend in different directions from each other and in parallel with the laminated surfaces so as to cross each other; and wherein the magnetic circuit forming layer guides the combined magnetic field generated by the two write lines, into the free layer in the vicinities of four corners of a crossing portion of the two write lines.

According to this forty-second configuration, a magnetic field required essentially for writing is applied to the free layer efficiently because the magnetic circuit forming layer guides a combined magnetic field into the free layers in the vicinities of the four corners of the crossing portion.

According to a forty-third configuration of the invention, there is provided a memory device defined in the thirty-ninth configuration, wherein the one or more write lines are electrically insulated from one another.

According to this forty-third configuration, a current for writing can be supplied to a desired memory cell stably because the write lines are electrically insulated from each other.

According to a forty-fourth configuration of the invention, there is provided a memory device defined in the thirty-ninth configuration, wherein the one or more write lines are disposed on the opposite side of the magnetoresistive effect element to the substrate.

Generally, to form a magnetoresistive effect element, the flatness of a substrate for the magnetoresistive effect element must be extremely high. It is therefore necessary to make the substrate for the magnetoresistive effect element sufficiently flat using CMP or the like. However, the thickness of each of write lines is relatively large, because it is necessary to allow a relatively large current to flow into the write lines for writing. Therefore, when the write lines are produced before the production of the magnetoresistive effect element, a lot of trouble and a large number of steps a required to make the substrate sufficiently flat because the substrate for the magnetoresistive effect element has large irregularities. On the other hand, according to the forty-fourth configuration, the magnetoresistive effect element can be produced before the production of the write lines. Accordingly, the substrate on which the magnetoresistive effect element should be produced has been already made sufficiently flat or has a surface having small irregularities, so that an extremely flat surface can be formed easily in the substrate. Thus, the process for forming the magnetoresistive effect element can be also made easy.

This specification also discloses memory devices according to the following paragraphs (1) to (4).

(1) A memory device including a plurality of memory cells connected electrically in series, and a plurality of switching elements connected in parallel with the memory cells in one-to-one correspondence;
wherein each of the memory cells is comprised of a magnetoresistive effect element according to any one of the twenty-third to thirty-seventh configurations; and
wherein each of the switching elements switches on/off between the one end and the other end of the series connection body of the magnetoresistive effect element connected in parallel with the switching element, in accordance with a signal inputted into a control input portion of the switching element.

(2) A memory device including a plurality of blocks arrayed;
wherein each of the blocks includes a plurality of memory cells connected electrically in series, and a plurality of switching elements connected in parallel with the memory cells in one-to-one correspondence;
wherein each of the memory cells is comprised of a magnetoresistive effect element according to any one of the twenty-third to thirty-seventh configurations; and
wherein each of the switching elements switches on/off between the one end and the other end of the series connection body of the magnetoresistive effect element connected in parallel with the switching element, in accordance with a signal inputted into a control input portion of the switching element.

(3) A memory device according to the paragraph (2);
wherein the plurality of blocks are arrayed in a two-dimensional matrix extending in a row direction and in a column direction, while the plurality of memory cells in each of the blocks are arrayed in the column direction;
wherein the control input portions of the plurality of switching elements in the plurality of blocks are connected through a plurality of first read selection lines in respective rows so that each of the first read selection lines is shared among the control input portions in a row corresponding to the first read selection line;
wherein each of the blocks includes a selection switch connected to one of series connection ends of the plurality of memory cells in the block;
wherein the other ends of series connections of the plurality of memory cells in the plurality of blocks are connected through a plurality of read lines in respective columns so that each of said read lines is shared among the other ends in a column corresponding to the read line; and
wherein control input portions of the selection switches in the plurality of blocks are connected through a plurality of second read selection lines in respective columns so that each of said second read selection lines is shared among the control input portions in a column corresponding to the second read section line.

(4) A memory device according to any one of the paragraphs (1) to (3), wherein each of the switching elements is a field effect transistor.

DETAILED DESCRIPTION OF PREFERRED EMBODIMENTS

Magnetoresistive effect elements and memory devices using the same according to the invention will be described below with reference to the drawings.

[First Embodiment]

Figure 1:
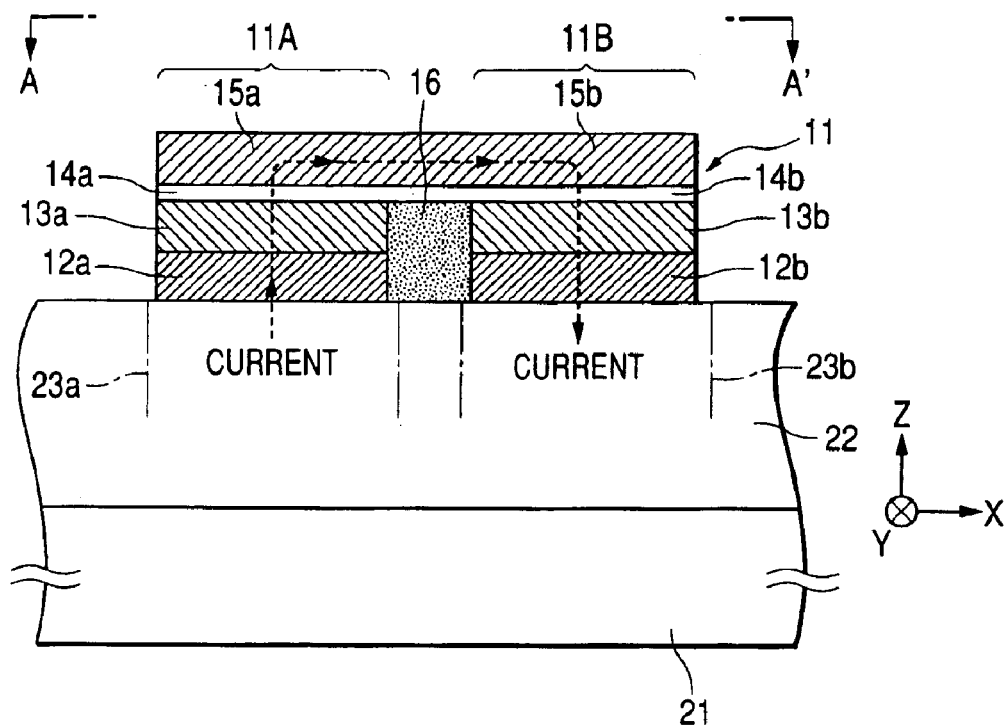
FIG. 1 is a schematic sectional view showing a TMR element according to a first embodiment of the invention.
Figure 2:
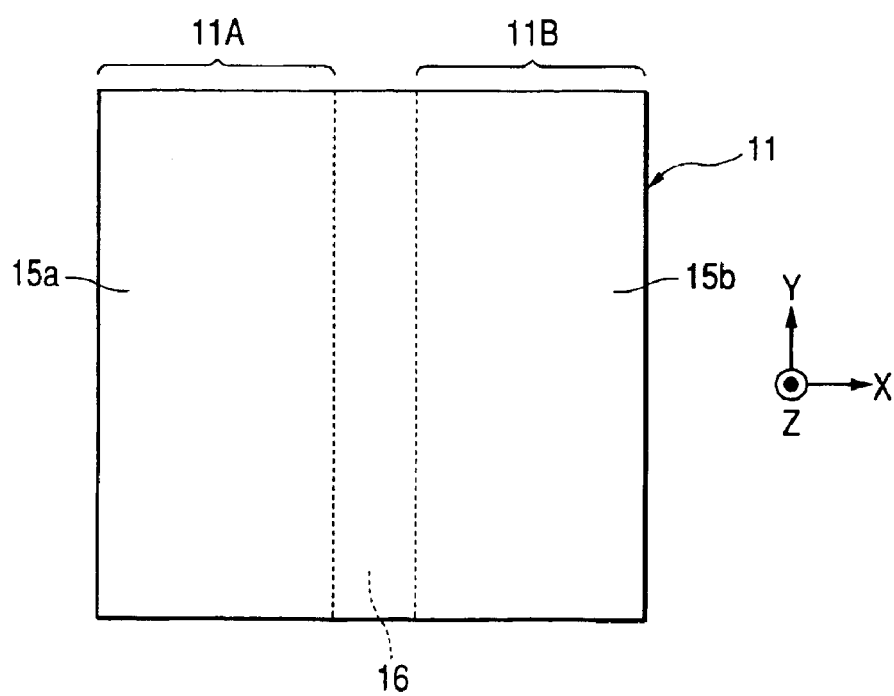
FIG. 2 is a plan view showing the TMR element in a direction of line A–A' in FIG. 1.

FIG. 1 is a schematic sectional view showing a TMR element 11 as a magnetoresistive effect element according to a first embodiment of the invention. FIG. 2 is a plan view showing the TMR element 11 in a direction of line A–A' in FIG. 1. In order to make the invention understood easily, X-, Y- and Z-axis every two of which make a right angle are defined as shown in FIGS. 1 and 2 (the same thing will be applied to the other drawings which will be described later). In addition, the arrowed direction on the Z-axis is referred to as "+Z direction" or "+Z side", while the reverse direction to the arrowed direction on the Z-axis is referred to as "–Z direction" or "–Z side". The same thing is applied to directions of the X-axis and the Y-axis. Occasionally, the +Z direction is referred to as "upper" while the –Z direction is referred to as "lower". The XY plane is parallel with the surface of a substrate 21.

In this embodiment, the TMR element 11 has two TMR element portions 11A and 11B, which are laminated onto a layer 22 on a semiconductor substrate 21 as a substrate individually. The TMR element portions 11A and 11B are disposed in the X-axis direction (parallel with their laminated surfaces) with respect to each other.

The TMR element portion 11A is constituted by a laminate formed out of a pin layer 12a, a pinned layer (second magnetic layer) 13a whose magnetization direction is fixed by the pin layer 12a, a tunnel barrier Layer 14a and a free layer (first magnetic layer) 15a, which layers are laminated in order of increasing distance from the bottom. The TMR element portion 11B has the same layer structure as the TMR element portion 11A. That is, the TMR element portion 11B is constituted by a laminate formed out of a pin layer 12b, a pinned layer (second magnetic layer) 13b whose magnetization direction is fixed by the pin layer 12b, a tunnel barrier layer 14b and a free layer (first magnetic layer) 15b, which layers are laminated in order of increasing distance from the bottom.

Each pin layer 12a, 12b is made from an antiferromagnetic layer. For example, it is preferable that the pin layer 12a, 12b is formed out of an Mn-based alloy such as PtMn, IrMn, RuRhMn, FeMn, NiMn, PdPtMn, RhMn or CrMnPt. Each of the pinned layers 13a and 13b and the free layers 15a and 15b is made from a ferromagnetic layer, and for example, formed out of a material such as Fe, Co, Ni, FeCo, NiFe, CoZrNb or FeCoNi. The magnetization direction of the pinned layer 13a, 13b is fixed in a predetermined direction by an exchange coupling bias magnetic field with the pin layer 12a, 12b. On the other hand, the magnetization direction of the free layer 15a, 15b is variable in response to an external magnetic field. Each tunnel barrier layer 14a, 14b is an insulating layer, formed out of a material such as $Al_2O_3$, NiO, GdO, MgO, $Ta_2O_5$, $MoO_2$, $TiO_2$ or $WO_2$.

Incidentally, for example, layers between which there is a difference in coercive force as disclosed in Japanese Patent Laid-Open No. 91949/1997 may be used as the first and second magnetic layers 13a and 15a. The same thing may be applied to the magnetic layers 13b and 15b. In this event, the pin layers 12a and 12b are removed. The same point can be applied to the other embodiments which will be described later.

In this embodiment, as shown in FIGS. 1 and 2, an insulating layer 16 extending in the Y-axis direction for separation is put between the pin layers 12a and 12b and between the pinned layers 13a and 13b so that the pin layers 12a and 12b and the pinned layers 13a and 13b are separated and electrically insulated from each other respectively. Incidentally, though not shown in FIGS. 1 and 2, the insulating layer 16 is formed to surround the whole circumferences of the pin layers 12a and 12b and the pinned layers 13a and 13b. On the other hand, the free layers 15a and 15b are formed integrally out of one and the same material, so as to form one and the same continuous layer. Thus, the TMR element portions 11A and 11B are connected electrically in series so as to form an electric series connection body. Incidentally, the tunnel barrier layers 14a and 14b are formed integrally out of one and the same material so as to form one and the same continuous layer.

In this embodiment, as shown in FIG. 1, a sensing current for detecting a change in magnetoresistance substantially flows in only through the pin layer 12a which is one end of the series connection body. The sensing current passes through the TMR element portions 11A and 11B in turn and then flows out only through the pin layer 12b which is the other end of the series connection body. Incidentally, not to say, the direction of the current may be reversed. The direction of the current flowing through an effective area (overlapping area (tunnel junction area) between the tunnel barrier layer 14a and the two layers 13a and 15a having the tunnel barrier layer 14a put therebetween) effective in changing the magnetoresistance in the TMR element portion 11A and the direction of the current flowing through an effective area (overlapping area (tunnel junction area) between the tunnel barrier layer 14b and the two layers 13b and 15b having the tunnel barrier layer 14b put therebetween) effective in changing the magnetoresistance in the TMR element portion 11B are substantially perpendicular to the laminated surfaces of the TMR element portions 11A and 11B respectively. The direction of the sensing current flowing through the tunnel junction area of the TMR element portion 11A is opposite to the direction of the sensing current flowing through the tunnel junction area of the TMR element portion 11B.

The number of the TMR element portions 11A and 11B is even, and the pin layer 12a and the pinned layer 13a on the lower side are electrically insulated from the pin layer 12b and the pinned layer 13b on the same side respectively. Accordingly, both the opposite ends of the series connection body are located on the lower side (substrate side).

In this embodiment, the sensing current is supplied from a circuit (not shown) constituted by the semiconductor substrate 21 and the layer 22. The semiconductor substrate 21 and the layer 22 correspond to a so-called IC substrate as a whole. In this embodiment, in the layer 22, a connection via 23a serving as a sensing current supply portion is formed under the pin layer 12a, and a connection via 23b serving as a sensing current receiving portion is formed under the pin layer 12b.

In this embodiment, the magnetization directions of the pinned layers 13a and 13b are set to be identical. Thus, the two pinned layers 13a and 13b can create a parallel or antiparallel state simultaneously with respect to the magnetization direction of the free layers 15a and 15b formed integrally.

Figure 3A:
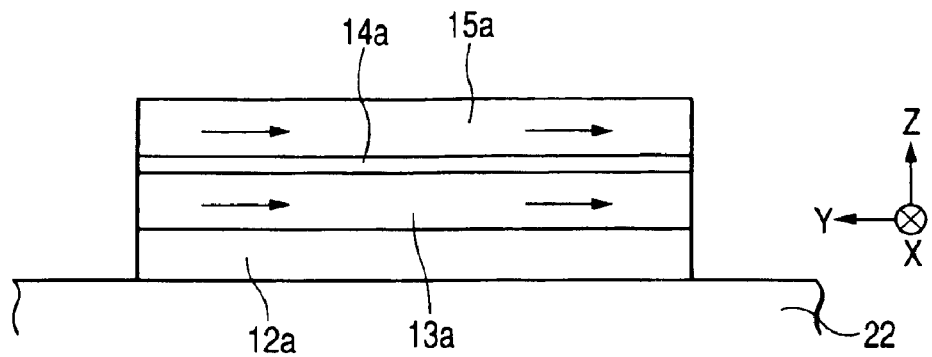
FIGS. 3A and 3B are diagrams showing examples of directions of magnetization in the TMR element shown in FIG. 1.
Figure 3B:
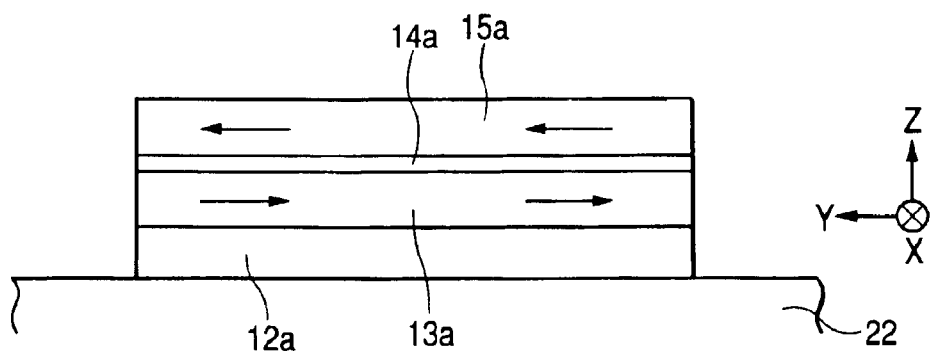

FIGS. 3A and 3B show examples of a state between the magnetization directions of the pinned layer 13a, 13b and the free layer 15a, 15b in the TMR element 11 according to this embodiment. FIG. 3A shows the parallel state between the magnetization directions, while FIG. 3B shows the antiparallel state between the magnetization directions. Fundamentally, the direction of the axis of easy magnetization in each of the pinned layers 13a and 13b and the free layers 15a and 15b can be set to be parallel or perpendicular to the Y-axis direction in which the insulating layer 16 extends. However, the energy of magnetization is stabilized in such a design that each pinned layer 13a, 13b is elongated in the direction of its axis of easy magnetization. It is therefore preferable that the axis of easy magnetization is set to be aligned with the longitudinal direction of the pinned layer 13a when the shape of the pinned layer 13a is made rectangular in plan view due to the dimensions of the TMR element 11. In this embodiment, therefore, the magnetization direction of each pinned layer 13a, 13b is set to be aligned with the −Y direction as shown in FIG. 3A or 3B because the Y-axis length of the pinned layer 13a, 13b having a rectangular shape in plan view is longer than the X-axis length of the pinned layer 13a, 13b as shown in FIG. 2.

Figure 5:
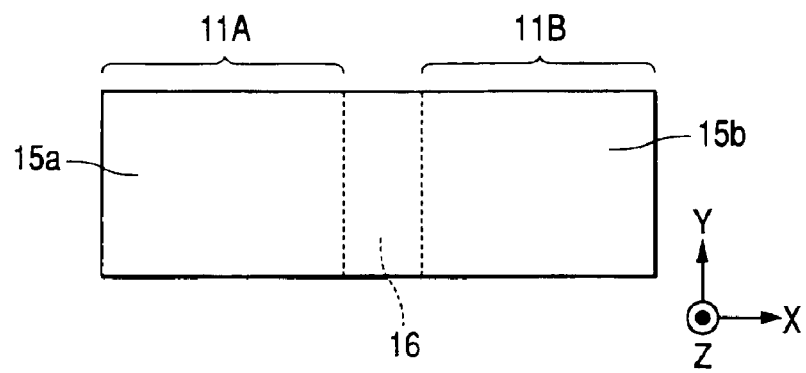
FIG. 5 is a plan view showing a TMR element according to a modification of the first embodiment.
Figure 6A:
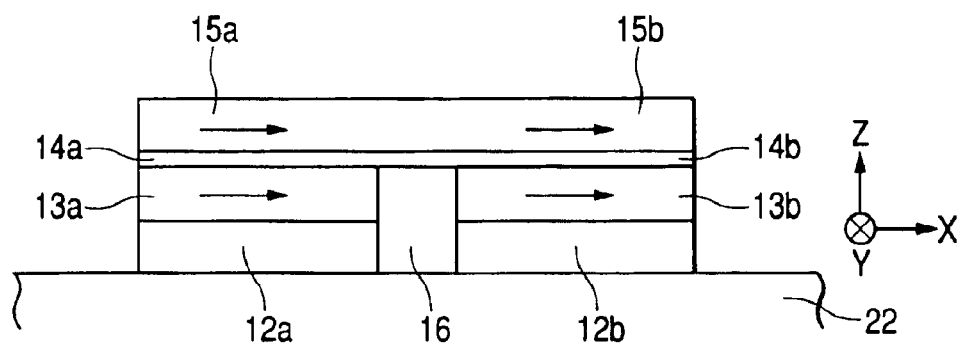
FIGS. 6A and 6B are diagrams showing examples of directions of magnetization in the TMR element shown in FIG. 5.
Figure 6B:
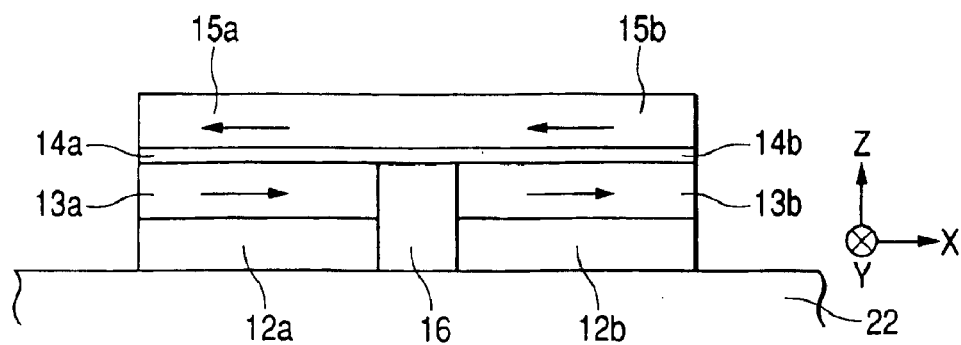

For the aforementioned reason, when the X-axis length of the pinned layer 13a, 13b having a rectangular shape in plan view is longer than the Y-axis length of the pinned layer 13a, 13b as shown in FIG. 5, it is preferable that the magnetization direction of the pinned layer 13a, 13b is set to be aligned with the X-axis direction where the pinned layer 13a, 13b is elongated in the direction of the axis of easy magnetization as shown in FIG. 6A or 6B.

Figure 4:
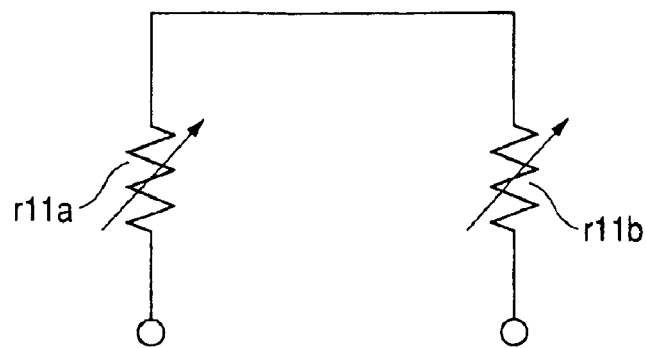
FIG. 4 is an equivalent circuit diagram of the TMR element shown in FIG. 1.

An equivalent circuit of the TMR element 11 in this embodiment is expressed by a series connection between a variable resistor r11a designating the resistance value of the TMR element portion 11A and a variable resistor r11b designating the resistance value of the TMR element portion 11B as shown in FIG. 4. In addition, the variable resistors r11a and r11b have one and the same increasing/decreasing tendency of a resistance value in accordance with the change in magnetization direction of the free layers 15a and 15b formed integrally.

Here, description will be made on an example of a method for manufacturing the TMR element 11 according to this embodiment with reference to FIGS. 7A to 7E. FIGS. 7A to 7E are schematic sectional views showing respective steps of the manufacturing method, correspondingly to FIG. 1.

Figure 7A:
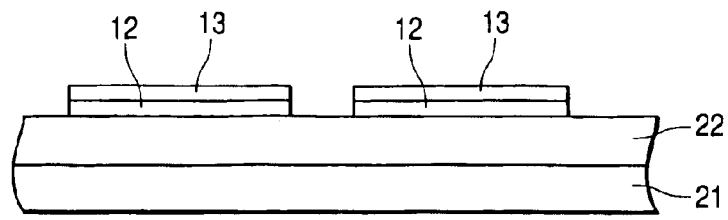
FIGS. 7A to 7E are schematic sectional views showing respective steps in a method for manufacturing the TMR element shown in FIG. 1.

First, the semiconductor substrate 21 manufactured in accordance with an intended application and having the layer 22 formed thereon is prepared. Next, an antiferromagneic layer 12 which is to serve as the pin layers 12a and 12b and a magnetic layer 13 which is to serve as the pinned layers 13a and 13b are formed on the layer 22 in turn by a sputtering method, a CVD method or the like. Next, the antiferromagneic layer 12 and the magnetic layer 13 are patterned by photolithography and etching in accordance with the shapes of the pin layers 12a and 12b and the pinned layers 13a and 13b (FIG. 7A).

Figure 7B:
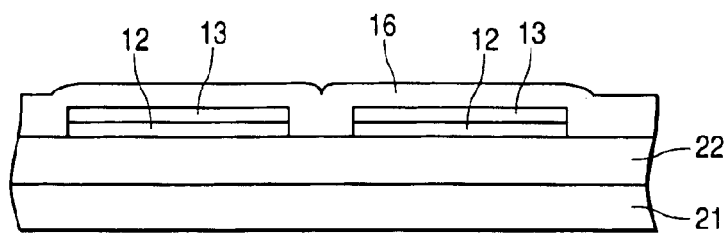

Next, a film serving as the insulating layer 16 is formed thereon by a sputtering method, a CVD method or the like (FIG. 7B). Next, the film is flattened by CMP (Chemical and Mechanical Polishing) until the magnetic layer 13 is exposed, so that the insulating layer 16 is left only in the portions which have been removed from the layers 12 and 13 in FIG. 7A (FIG. 7C).

Figure 7C:
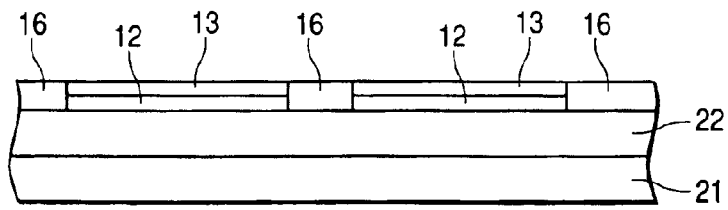
Figure 7D:
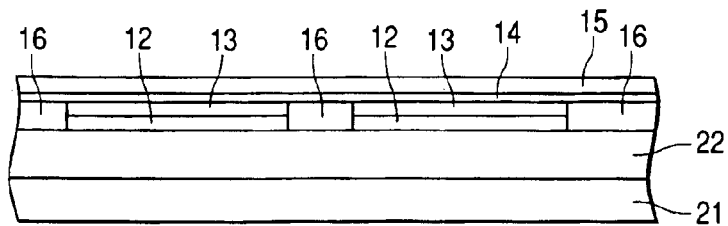

Next, an insulating layer 14 which is to serve as the tunnel barrier layers 14a and 14b and a magnetic layer 15 which is to serve as the free layers 15a and 15b extending continuously and integrally are formed in turn on the substrate in the state shown in FIG. 7C, by a sputtering method or the like (FIG. 7D).

Figure 7E:
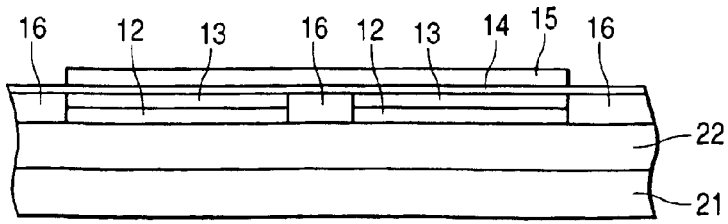

After that, the layer 15 is patterned by photolithography and etching (FIG. 7E). Thus, the TMR element 11 is completed.

A voltage to be applied to the TMR element 11 is required for supplying the sensing current. According to this embodiment, a voltage applied is divided into partial voltages to be applied to the TMR element portions 11A and 11B respectively because the two TMR element portions 11A and 11B are connected in series. Thus, the voltage applied to each TMR element portion 11A, 11B is reduced. As a result, the lowering of the MR ratio caused by the voltage bias characteristic is reduced so that the MR ratio is improved. Thus, the sensitivity of the TMR element 11 for detecting a change in magnetoresistance is enhanced.

In addition, in this embodiment, the pin layers 12a and 12b located on the lower side serve as the input and output terminals of the TMR element 11. Accordingly, when the input and output terminals of the TMR element 11 are electrically connected to the semiconductor substrate 21 side, the manufacturing process involved in electric connections of the input and output terminals can be made easy.

Incidentally, in this embodiment, nonmagnetic metal layers of Cu or the like may be formed in place of the tunnel barrier layers 14a and 14b respectively. In this case, the nonmagnetic metal layers are also separated electrically by the insulating layer 16. In this case, the magnetoresistive effect element becomes a GMR element. The same points can be applied to the other embodiments which will be described later.

[Second Embodiment]

Figure 8:
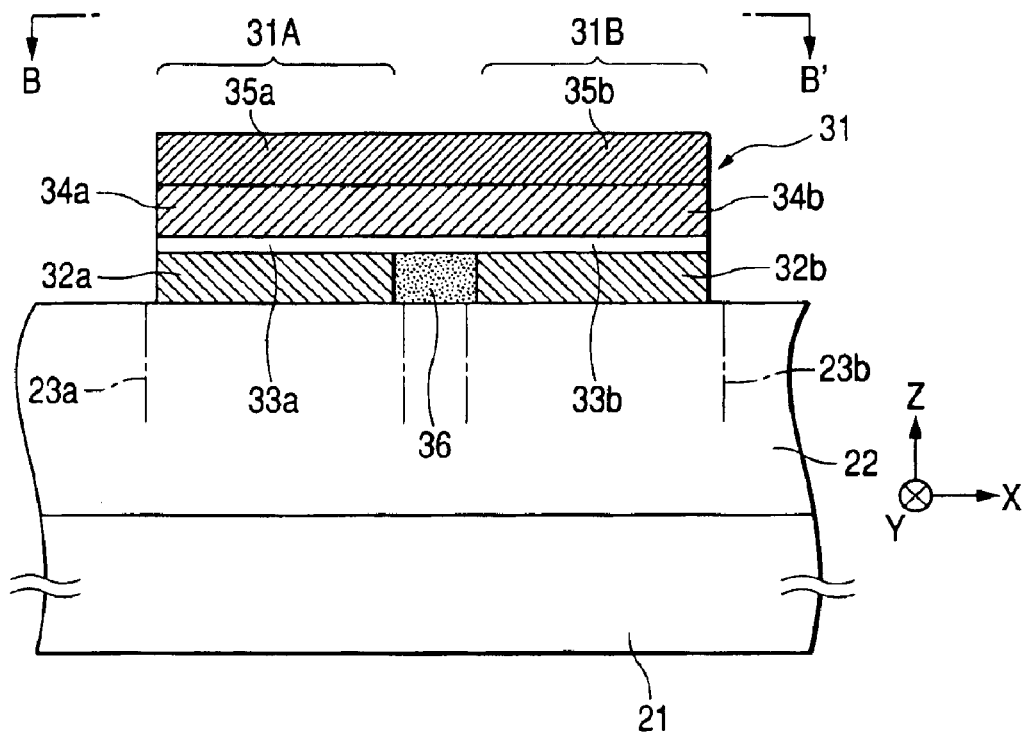
FIG. 8 is a schematic sectional view showing a TMR element according to a second embodiment of the invention.
Figure 9:
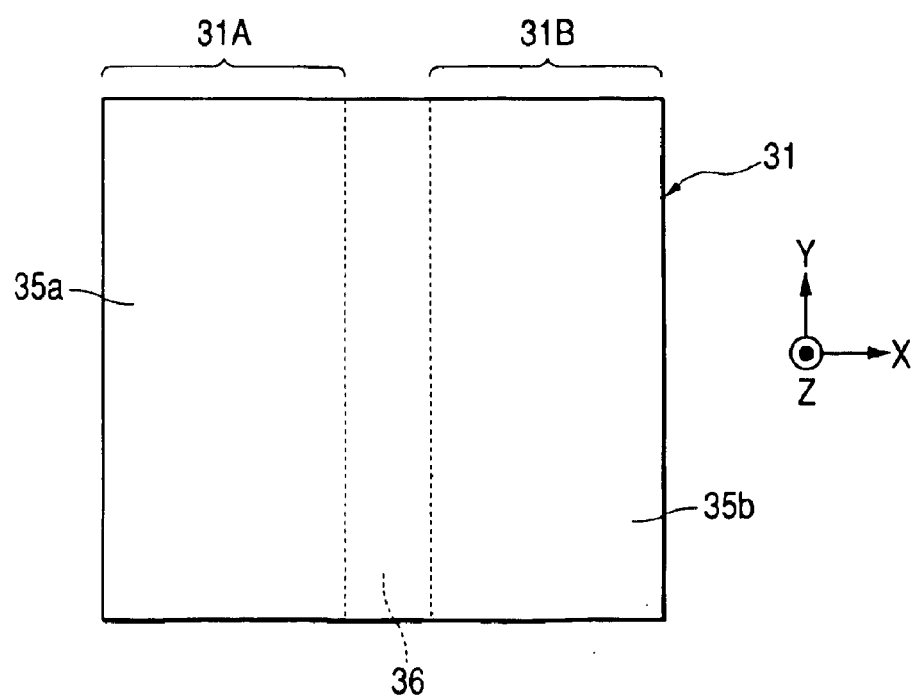
FIG. 9 is a plan view showing the TMR element in a direction of line B–B' in FIG. 8.

FIG. 8 is a schematic sectional view showing a TMR element 31 according to a second embodiment of the invention. FIG. 9 is a plan view showing the TRM element 31 in a direction of line B–B' in FIG. 8.

In this embodiment, the TMR element 31 has two TMR element portions 31A and 31B, which are laminated onto a layer 22 on a semiconductor substrate 21 individually, in the same manner as in the first embodiment. The TMR element portions 31A and 31B are disposed in the X-axis direction (parallel with their laminated surfaces) with respect to each other.

The TMR element portion 31A is constituted by a laminate formed out of a free layer (first magnetic layer) 32a, a tunnel barrier layer 33a, a pinned layer (second magnetic layer) 34a and a pin layer 35a, which layers are laminated in order of increasing distance from the bottom. The TMR element portion 31B has the same layer structure as the TMR element portion 31A. That is, the TMR element portion 31B is constituted by a laminate formed out of a free layer (first magnetic layer) 32b, a tunnel barrier layer 33b, a pinned layer (second magnetic layer) 34b and a pin layer 35b, which layers are laminated in order of increasing distance from the bottom.

In this embodiment, as shown in FIGS. 8 and 9, an insulating layer 36 extending in the Y-axis direction for separation is put between the free layers 32a and 32b so that the free layers 32a and 32b are separated and electrically insulated from each other. On the other hand, the pinned layers 34a and 34b are formed integrally out of one and the same material, so as to form one and the same continuous layer. In addition, the pin layers 35a and 35b are formed integrally out of one and the same material, so as to form one and the same continuous layer. Thus, the TMR element portions 31A and 31B are connected electrically in series so as to form an electric series connection body. Incidentally, the tunnel barrier layers 33a and 33b are formed integrally out of one and the same material so as to form one and the same continuous layer.

In this embodiment, a sensing current for detecting a change in magnetoresistance substantially flows in only through the free layer 32a which is one end of the series connection body. The sensing current passes through the TMR element portions 31A and 31B in turn and then flows out only through the free layer 32b which is the other end of the series connection body.

Incidentally, for example, the magnetization directions of the pinned layers 34a and 34b formed integrally are set to be aligned with the X-axis direction or the Y-axis direction.

Also according to this embodiment, advantages similar to those in the first embodiment can be obtained.

[Third Embodiment]

Figure 10:
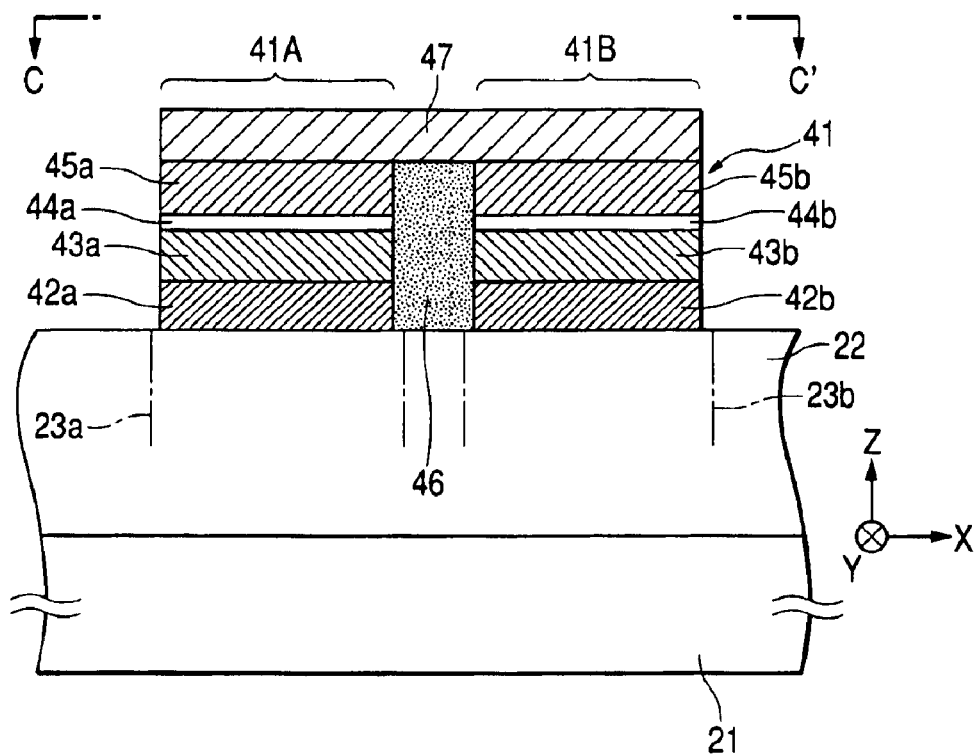
FIG. 10 is a schematic sectional view showing a TMR element according to a third embodiment of the invention.
Figure 11:
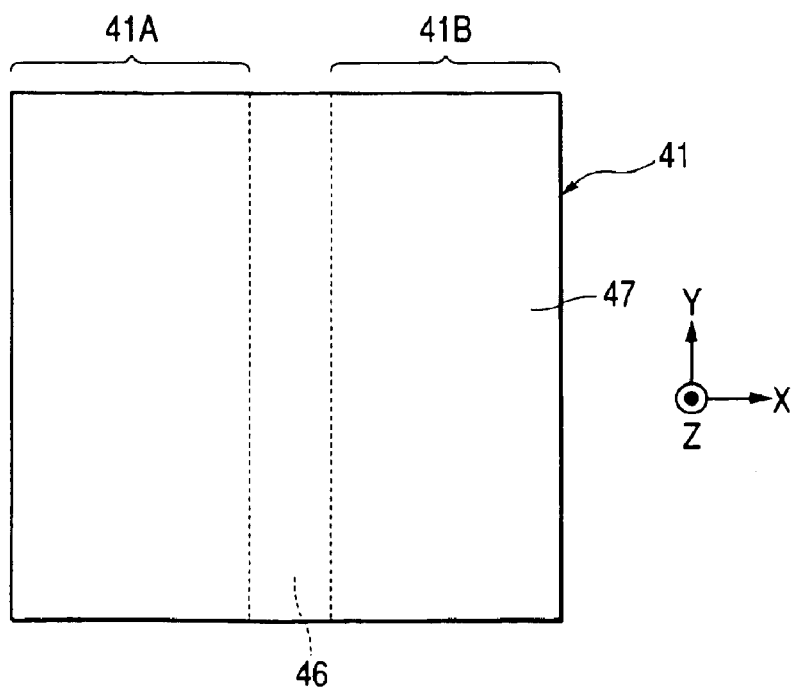
FIG. 11 is a plan view showing the TMR element in a direction of line C–C' in FIG. 10.

FIG. 10 is a schematic sectional view showing a TMR element 41 according to a third embodiment of the invention. FIG. 11 is a plan view showing the TMR element 41 in a direction of line C–C' in FIG. 10.

In this embodiment, the TMR element 41 has two TMR element portions 41A and 41B, which are laminated onto a layer 22 on a semi-conductor substrate 21 individually, in the same manner as in the first embodiment. The TMR element portions 41A and 41B are disposed in the X-axis direction (parallel with their laminated surfaces) with respect to each other.

The TMR element portion 41A is constituted by a laminate formed out of a pin layer 42a, a pinned layer (second magnetic layer) 43a, a tunnel barrier layer 44a and a free layer (first magnetic layer) 45a, which layers are laminated in order of increasing distance from the bottom. The TMR element portion 41B has the same layer structure as the TMR element portion 41A. That is, the TMR element portion 41B is constituted by a laminate formed out of a pin layer 42b, a pinned layer (second magnetic layer) 43b, a tunnel barrier layer 44b and a free layer (first magnetic layer) 45b, which layers are laminated in order of increasing distance from the bottom.

In this embodiment, as shown in FIGS. 10 and 11, an insulating layer 46 extending in the Y-axis direction for separation is put between the pin layers 42a and 42b, between the pinned layers 43a and 43b, between the tunnel barrier layers 44a and 44b and between the free layers 45a and 45b so that the pin layers 42a and 42b, the pinned layers 43a and 43b, the tunnel barrier layers 44a and 44b and the free layers 45a and 45b are separated and electrically insulated from each other respectively. Incidentally, though not shown in FIGS. 10 and 11, the insulating layer 46 is formed to surround the whole circumferences of the pin layers 42a and 42b, the pinned layers 43a and 43b, the tunnel barrier layers 44a and 44b and the free layers 45a and 45b. An antiferromagnetic layer 47 is formed on the free layers 45a and 45b and the insulating layer 46 so as to extend continuously and integrally. Thus, the TMR element portions 41A and 41B are connected electrically in series so as to form an electric series connection body.

In this embodiment, a sensing current for detecting a change in magnetoresistance substantially flows in only through the pin layer 42a which is one end of the series connection body. The sensing current passes through the TMR element portions 41A and 41B in turn and then flows out only through the pin layer 42b which is the other end of the series connection body. Incidentally, not to say, the direction of the current may be reversed.

In this embodiment, the magnetization directions of the pinned layers 43a and 43b are set to be identical, for example, set to be aligned with the X-axis direction or the Y-axis direction.

Here, description will be made on an example of a method for manufacturing the TMR element 41 according to this embodiment with reference to FIGS. 12A to 12E. FIGS. 12A to 12E are schematic sectional views showing respective steps of the manufacturing method, correspondingly to FIG. 10.

Figure 12A:
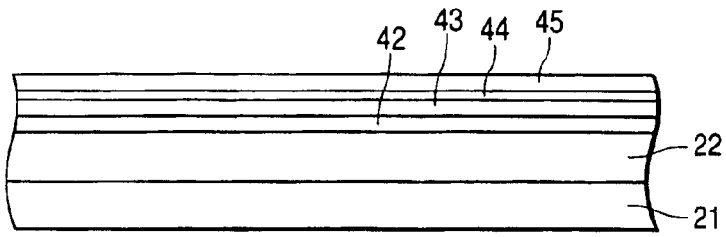
FIGS. 12A to 12E are schematic sectional views showing respective steps in a method for manufacturing the TMR element shown in FIG. 10.

First, the semiconductor substrate 21 manufactured in accordance with an intended application and having the layer 22 formed thereon is prepared. Next, an antiferromagneic layer 42 which is to serve as the pin layers 42a and 42b, a magnetic layer 43 which is to serve as the pinned layers 43a and 43b, an insulating layer 44 which is to serve as the tunnel barrier layers 44a and 44b and a magnetic layer 45 which is to serve as the free layers 45a and 45b are formed on the layer 22 in turn by a sputtering method, a CVD method or the like (FIG. 12A).

Figure 12B:
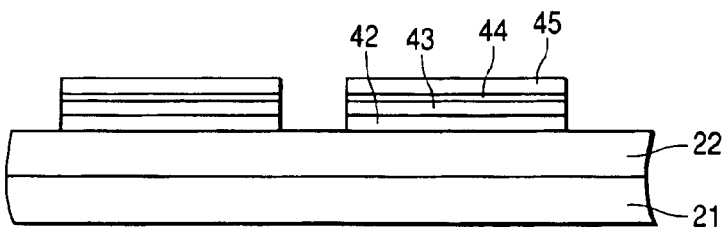

Next, the layers 42 to 45 are patterned by photolithography and etching in accordance with the shapes of the pin layers 42a and 42b, the pinned layers 43a and 43b, the tunnel barrier layers 44a and 44b and the free layers 45a and 45b (FIG. 12B).

Next, a film serving as the insulating layer 46 is formed thereon by a sputtering method, a CVD method or the like. After that, the film is flattened by CMP until the magnetic layer 45 is exposed, and the insulating layer 46 is left only in the portions which have been removed from the layers 42 to 45 in FIG. 12B (FIG. 12C).

Figure 12C:
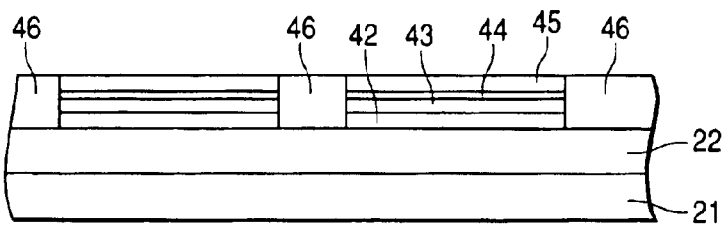
Figure 12D:
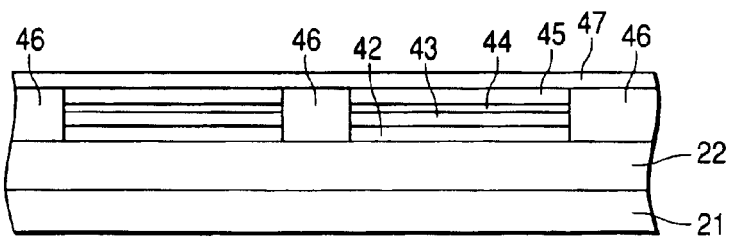

Next, the antiferromagnetic layer 47 is formed on the substrate in the state shown in FIG. 12C by a sputtering method or the like (FIG. 12D).

Figure 12E:
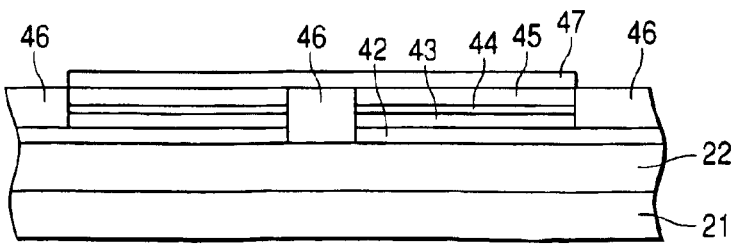

After that, the layer 47 is patterned by photolithography and etching (FIG. 12E). Thus, the TMR element 41 is completed.

According to this embodiment, advantages similar to those in the first embodiment can be obtained. Incidentally, a nonmagnetic conductive layer of Cu or the like may be formed in place of the antiferromagnetic layer 47. Alternatively, a resistor layer of ruthenium oxide or the like may be formed in place of the antiferromagnetic layer 47.

[Fourth Embodiment]

Figure 13:
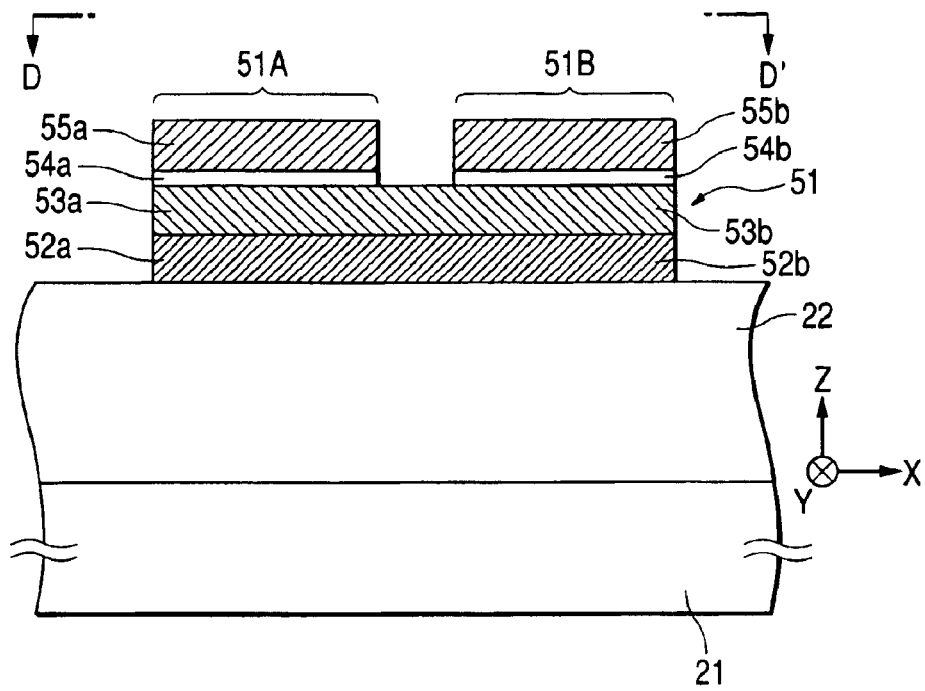
FIG. 13 is a schematic sectional view showing a TMR element according to a fourth embodiment of the invention.
Figure 14:
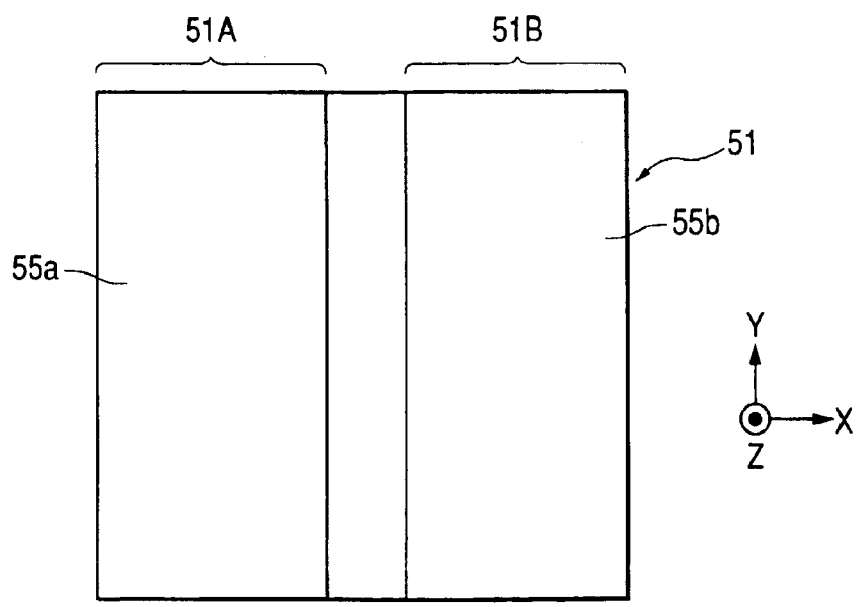
FIG. 14 is a plan view showing the TMR element in a direction of line D–D' in FIG. 13.

FIG. 13 is a schematic sectional view showing a TMR element 51 according to a fourth embodiment of the invention. FIG. 14 is a plan view showing the TMR element 51 in a direction of line D–D' in FIG. 13.

In this embodiment, the TMR element 51 has two TMR element portions 51A and 51B, which are laminated onto a layer 22 on a semiconductor substrate 21 individually. The TMR element portions 51A and 51B are disposed in the X-axis direction (parallel with their laminated surfaces) with respect to each other.

The TMR element portion 51A is constituted by a laminate formed out of a pin layer 52a, a pinned layer (second magnetic layer) 53a, a tunnel barrier layer 54a and a free layer (first magnetic layer) 55a, which layers are laminated in order of increasing distance from the bottom. The TMR element portion 51B has the same layer structure as the TMR element portion 51A. That is, the TMR element portion 51B is constituted by a laminate formed out of a pin layer 52b, a pinned layer (second magnetic layer) 53b, a tunnel barrier layer 54b and a free layer (first magnetic layer) 55b, which layers are laminated in order of increasing distance from the bottom.

In this embodiment, as shown in FIGS. 13 and 14, the free layers 55a and 55b are separated and electrically insulated from each other. On the other hand, the pin layers 52a and 52b are formed integrally out of one and the same material, so as to form one and the same continuous layer. In addition, the pinned layers 53a and 53b are formed integrally out of one and the same material, so as to form one and the same continuous layer. Thus, the TMR element portions 51A and 51B are connected electrically in series so as to form an electric series connection body. Incidentally, the tunnel barrier layers 54a and 54b are also separated from each other.

In this embodiment, a sensing current for detecting a change in magnetoresistance substantially flows in only through the free layer 55a which is one end of the series connection body. The sensing current passes through the TMR element portions 51A and 51B in turn and then flows out only through the free layer 55b which is the other end of the series connection body. Incidentally, each free layer 55a, 55b is designed to be electrically connected to a predetermined portion through a not-shown wiring layer or the like.

Incidentally, for example, the magnetization directions of the pinned layers 53a and 53b formed integrally are set to be aligned with the X-axis direction or the Y-axis direction.

Also according to this embodiment, advantages similar to those in the first embodiment can be obtained.

[Fifth Embodiment]

Figure 15:
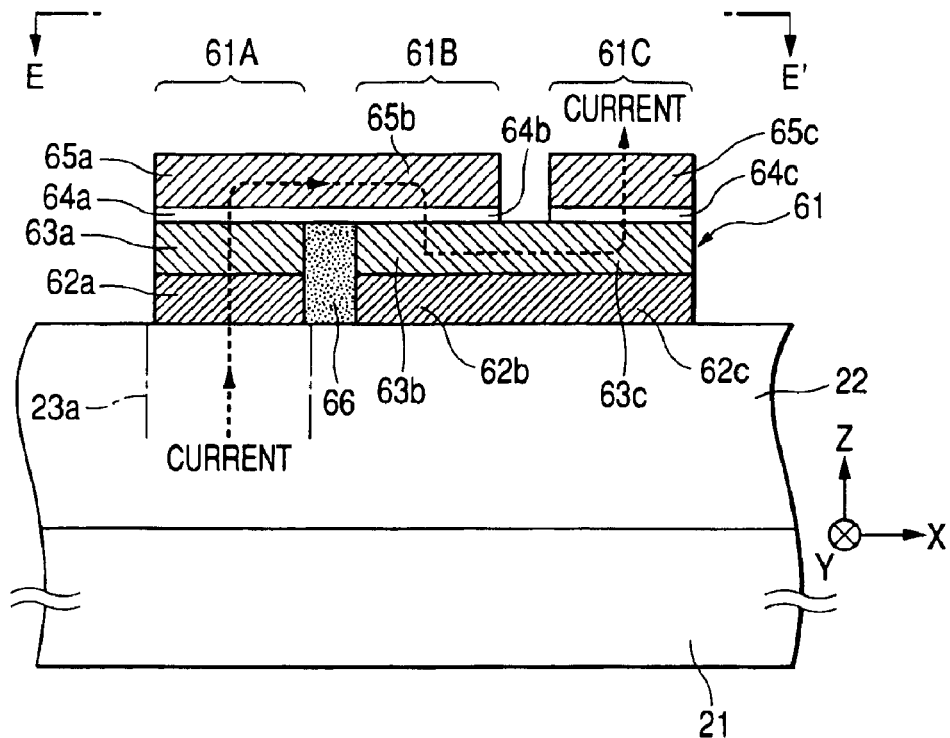
FIG. 15 is a schematic sectional view showing a TMR element according to a fifth embodiment of the invention.
Figure 16:
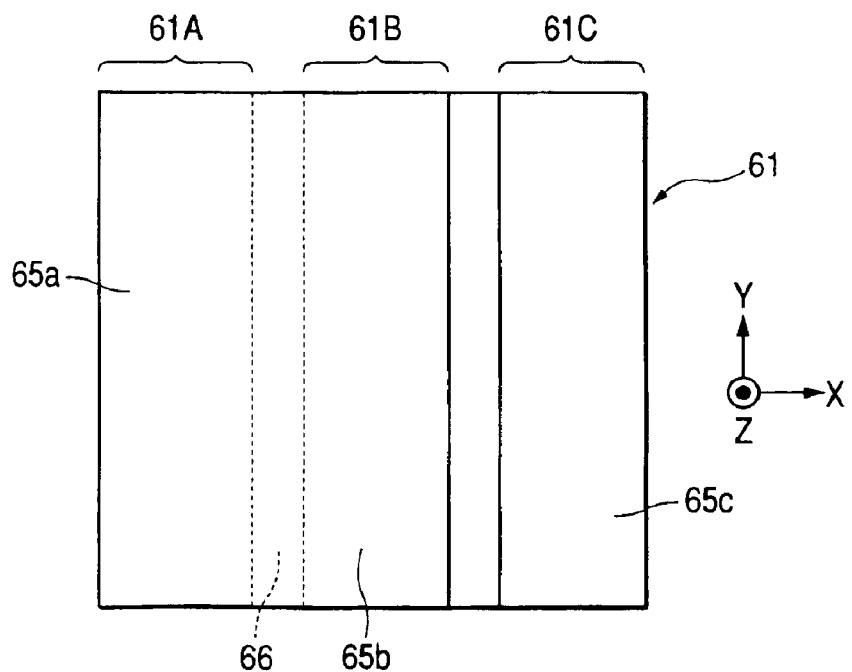
FIG. 16 is a plan view showing the TMR element in a direction of line E–E' in FIG. 15.

FIG. 15 is a schematic sectional view showing a TMR element 61 according to a fifth embodiment of the invention. FIG. 16 is a plan view showing the TMR element 61 in a direction of line E–E' in FIG. 15.

In this embodiment, the TMR element 61 has three TMR element portions 61A, 61B and 61C, which are laminated onto a layer 22 on a semiconductor substrate 21 individually. The TMR element portions 61A, 61B and 61C are disposed in the X-axis direction (parallel with their laminated surfaces) with respect to one another.

The TMR element portion 61A is constituted by a laminate formed out of a pin layer 62a, a pinned layer 63a, a tunnel barrier layer 64a and a free layer 65a, which layers are laminated in order of increasing distance from the bottom. The TMR element portion 61B has the same layer structure as the TMR element portion 1A. That is, the TMR element port on 61B is constituted by a laminate formed out of a pin layer 62b, a pinned layer 63b, a tunnel barrier layer 64b and a free layer 65b, which layers are laminated in order of increasing distance from the bottom. The TMR element portion 61C has the same layer structure as the TMR element portion 61A. That is, the TMR element portion 61C is constituted by a laminate formed out of a pin layer 62c, a pinned layer 63c, a tunnel barrier layer 64c and a free layer 65c, which layers are laminated in order of increasing distance from the bottom.

In this embodiment, as shown in FIGS. 15 and 16, an insulating layer 66 extending in the Y-axis direction for separation is put between the pin layers 62a and 62b and between the pinned layers 63a and 63b so that the pin layers 62a and 62b and the pinned layers 63a and 63b are separated and electrically insulated from each other respectively. The free layers 65a and 65b are formed integrally out of one and the same material, so as to form one and the same continuous layer. The free layers 65b and 65c are separated and electrically insulated from each other. The pin layers 62b and 62c are formed integrally out of one and the same material, so as to form one and the same continuous layer. The pinned layers 63b and 63c are formed integrally out of one and the same material, so as to form one and the same continuous layer. Thus, the TMR element portions 61A, 61B and 61C are connected electrically in series so as to form an electric series connection body. Incidentally, the tunnel barrier layers 64a and 64b are formed integrally out of one and the same material so as to form one and the same continuous layer. The tunnel barrier layers 64b and 64c are separated from each other.

In this embodiment, a sensing current for detecting a change in magnetoresistance substantially flows in only through the pin layer 62a which is one end of the series connection body. The sensing current passes through the TMR element portions 61A, 61B and 61C in turn and then flows out only through the free layer 65c which is the other end of the series connection body. Incidentally, not to say, the direction of the current may be reversed. Incidentally, the free layer 65c is designed to be electrically connected to a predetermined portion through a not-shown wiring layer or the like.

In this embodiment, the magnetization directions of the pinned layers 63a, 63b and 63c are set to be identical, for example, set to be aligned with the Y-axis direction.

Figure 17:
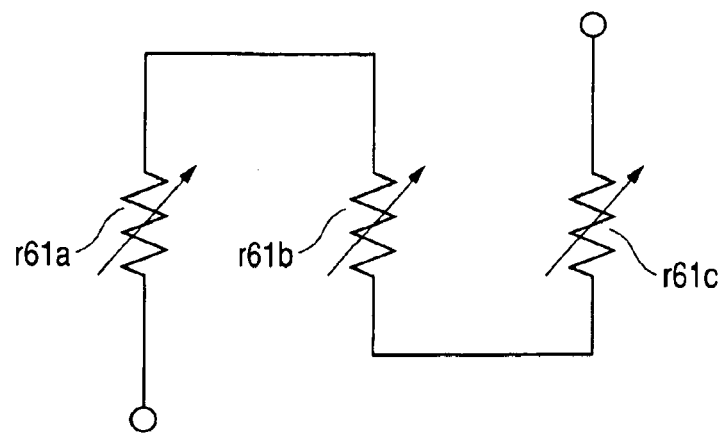
FIG. 17 is an equivalent circuit diagram of the TMR element shown in FIG. 15.

An equivalent circuit of the TMR element 61 in this embodiment is expressed by a series connection among a variable resistor r61a designating the resistance value of the TMR element portion 61A, a variable resistor r61b designating the resistance value of the TMR element portion 61B and a variable resistor r61c designating the resistance value of the TMR element portion 61C as shown in FIG. 17. In addition, the variable resistors r61a, r61b and r61c have one and the same increasing/decreasing tendency of a resistance value in accordance with the change in magnetization direction of the free layers 65a and 65b formed integrally and the free layer 65c.

Also according to this embodiment, advantages similar to those in the first embodiment can be obtained.

[Sixth Embodiment]

Figure 18:
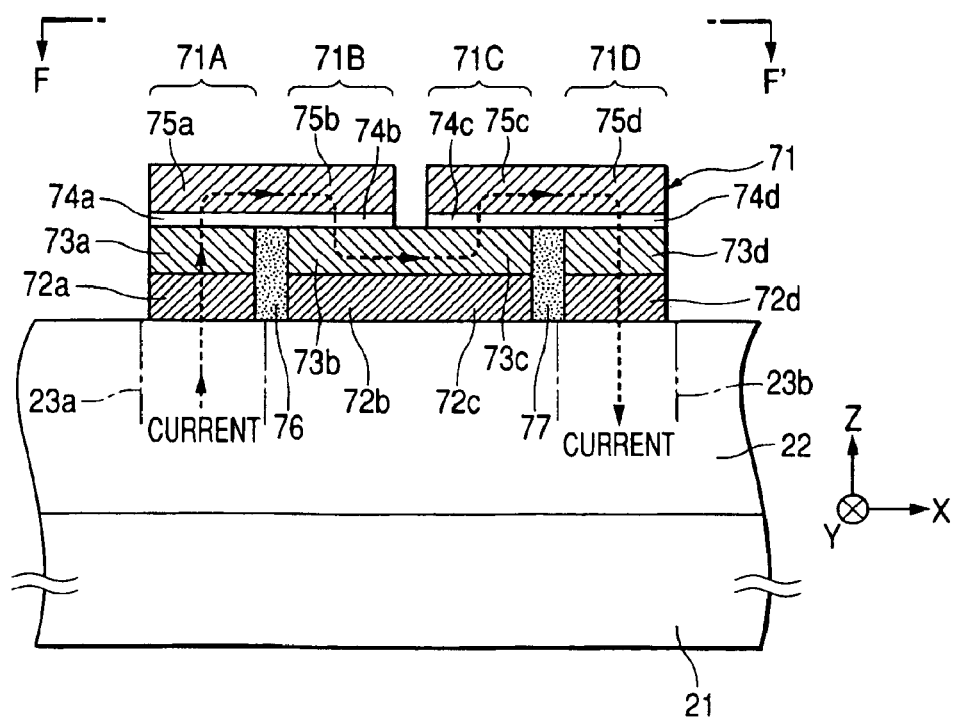
FIG. 18 is a schematic sectional view showing a TMR element according to a sixth embodiment of the invention.
Figure 19:
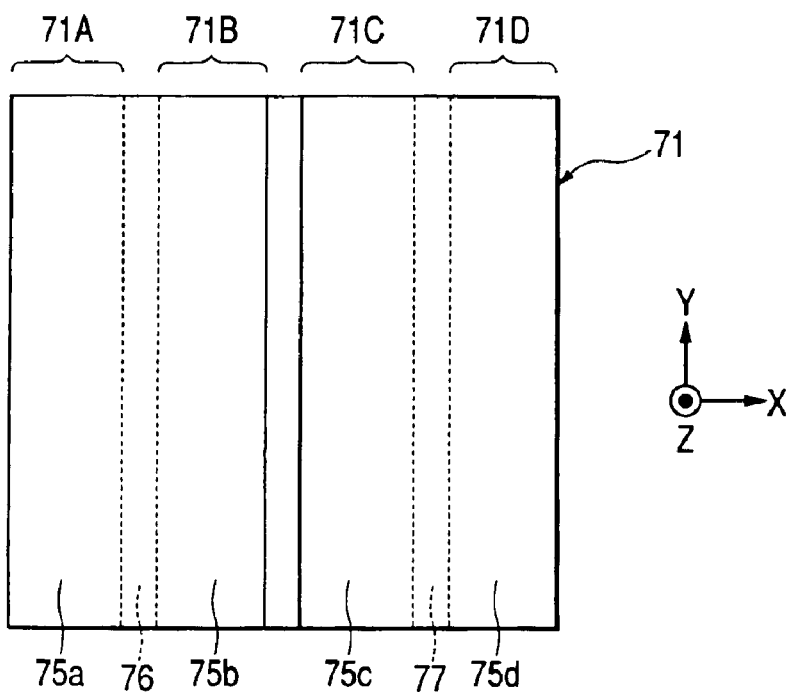
FIG. 19 is a plan view showing the TMR element in a direction of line F–F' in FIG. 18.

FIG. 18 is a schematic sectional view showing a TMR element 71 according to a sixth embodiment of the invention. FIG. 19 is a plan view of the TMR element 71 in a direction of line F–F' in FIG. 18.

In this embodiment, the TMR element 71 has four TMR element portions 71A, 71B, 71C and 71D, which are laminated onto a layer 22 on a semiconductor substrate 2l individually. The TMR element portions 71A, 71B, 71C and 71D are disposed in the X-axis direction (parallel with their laminated surfaces) with respect to one another.

The TMR element portion 71A is constituted by a laminate formed out of a pin layer 72a, a pinned layer 73a, a tunnel barrier layer 74a and a free layer 75a, which layers are laminated in order of increasing distance from the bottom. The TMR element portion 71B has the same layer structure as the TMR element portion 71A. That is, the TMR element portion 71B is constituted by a laminate formed out of a pin layer 72b, a pinned layer 73b, a tunnel barrier layer 74b and a free layer 75b, which layers are laminated in order of increasing distance from the bottom. The TMR element portion 71C has the same layer structure as the TMR element portion 71A. That is, the TMR element portion 71C is constituted by a laminate formed out of a pin layer 72c, a pinned layer 73c, a tunnel barrier layer 74c and a free layer 75c, which layers are laminated in order of increasing distance from the bottom. The TMR element portion 71D has the same layer structure as the TMR element portion 71A. That is, the TMR element portion 71D is constituted by a laminate formed out of a pin layer 72d, a pinned layer 73d, a tunnel barrier layer 74d and a free layer 75d, which layers are laminated in order of increasing distance from the bottom.

In this embodiment, as shown in FIGS. 18 and 19, an insulating layer 76 extending in the Y-axis direction for separation is put between the pin layers 72a and 72b and between the pinned layers 73a and 73b so that the pin layers 72a and 72b and the pinned layers 73a and 73b are separated and electrically insulated from each other respectively. The free layers 75a and 75b are formed integrally out of one and the same material, so as to form one and the same continuous layer. The free layers 75b and 75c are separated and electrically insulated from each other. The pin layers 72b and 72c are formed integrally out of one and the same material, so as to form one and the same continuous layer. The pinned layers 73b and 73c are formed integrally out of one and the same material, so as to form one and the same continuous layer. An insulating layer 77 extending in the Y-axis direction for separation is put between the pin layers 72c and 72d and between the pinned layers 73c and 73d so that the pin layers 72c and 72d and the pinned layers 73c and 73d are separated and electrically insulated from each other respectively. The free layers 75c and 75d are formed integrally out of one and the same material, so as to form one and the same continuous layer. Thus, the TMR element portions 71A, 71B, 71C and 71D are connected electrically in series so as to form an electric series connection body. Incidentally, the tunnel barrier layers 74a and 74b are formed integrally out of one and the same material so as to form one and the same continuous layer. The tunnel barrier layers 74b and 74c are separated from each other. The tunnel barrier layers 74c and 74d are formed integrally out of one and the same material so as to form one and the same continuous layer.

In this embodiment, a sensing current for detecting a change in magnetoresistance substantially flows in only through the pin layer 72a which is one end of the series connection body. The sensing current passes through the TMR element portions 71A, 71B, 71C and 71D in turn and then flows out only through the pin layer 72d which is the other end of the series connection body. Incidentally, not to say, the direction of the current may be reversed.

In this embodiment, the magnetization directions of the pinned layers 73a, 73b, 73c and 73d are set to be identical, for example, set to be aligned with the Y-axis direction.

Figure 20:
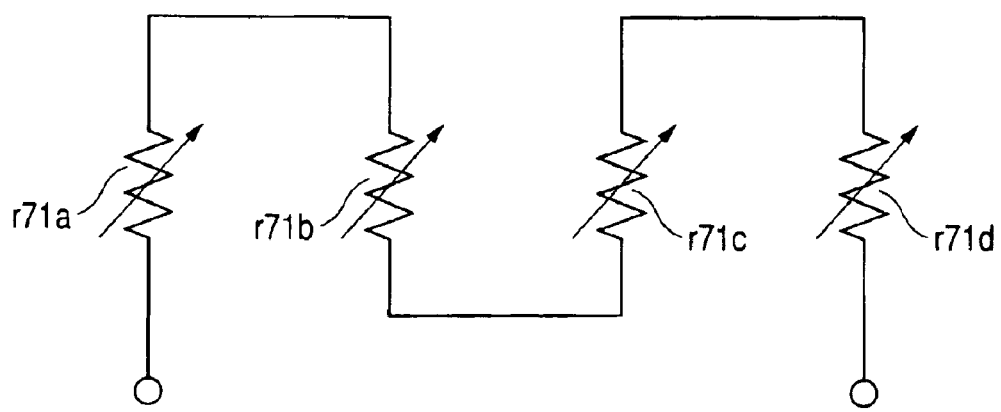
FIG. 20 is an equivalent circuit diagram of the TMR element shown in FIG. 18.

An equivalent circuit of the TMR element 71 in this embodiment is expressed by a series connection among a variable resistor r71a designating the resistance value of the TMR element portion 71A, a variable resistor r71b designating the resistance value of the TMR element portion 71B, a variable resistor r71c designating the resistance value of the TMR element portion 71C and a variable resistor r71d designating the resistance value of the TMR element portion 71D as shown in FIG. 20. In addition, the variable resistors r71a, r71b, r71c and r71d have one and the same increasing/decreasing tendency of a resistance value in accordance with the change in magnetization direction of the free layers 75a and 75b formed integrally and the free layers 75c and 75d formed integrally.

Also according to this embodiment, advantages similar to those in the first embodiment can be obtained.

[Seventh Embodiment]

Figure 21:
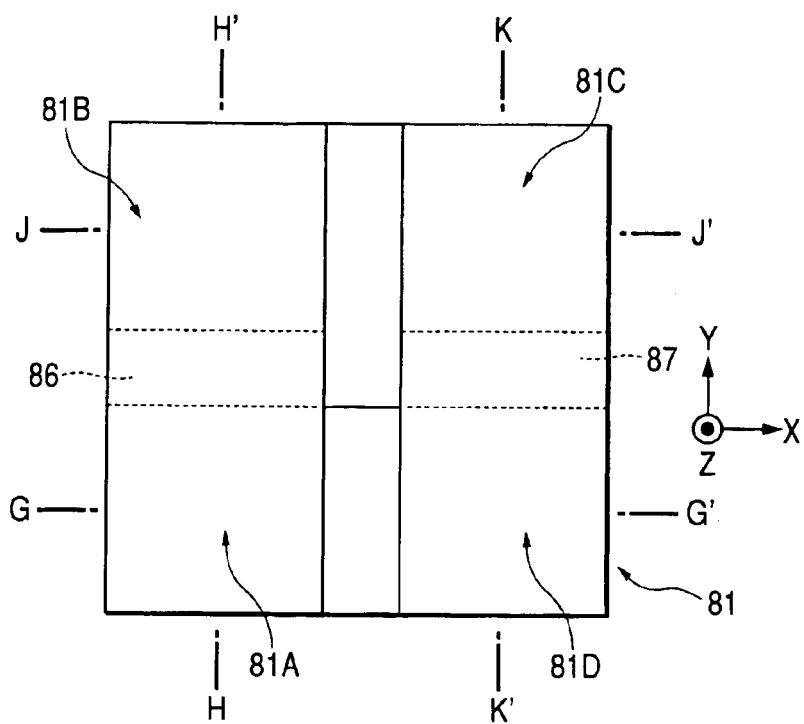
FIG. 21 is a schematic plan view showing a TMR element according to a seventh embodiment of the invention.
Figure 22:
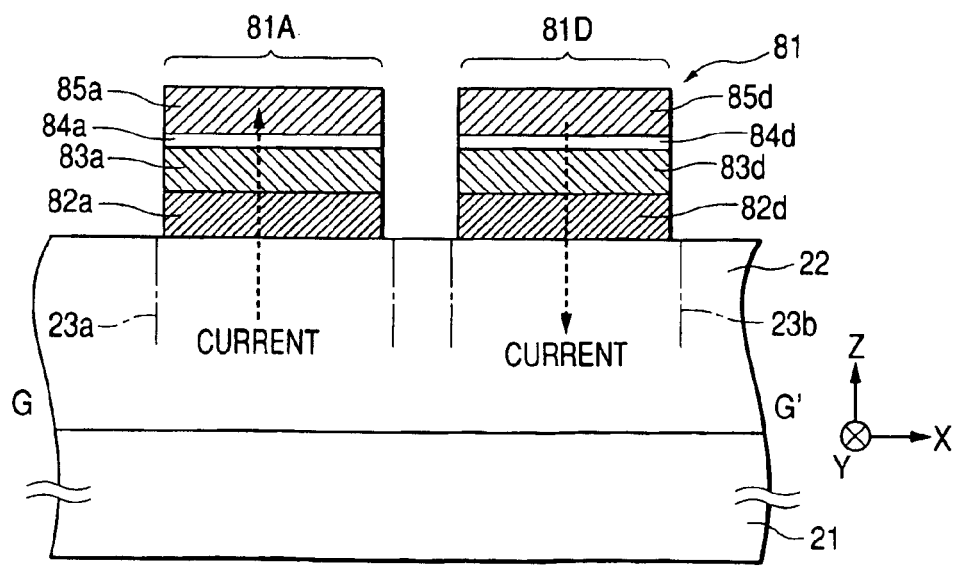
FIG. 22 is a schematic sectional view taken on line G–G' in FIG. 21.

FIG. 21 is a schematic plan view showing a TMR element 81 according to a seventh embodiment of the invention. FIG. 22 is a schematic sectional view taken on line G–G' in FIG. 21.

Figure 23:
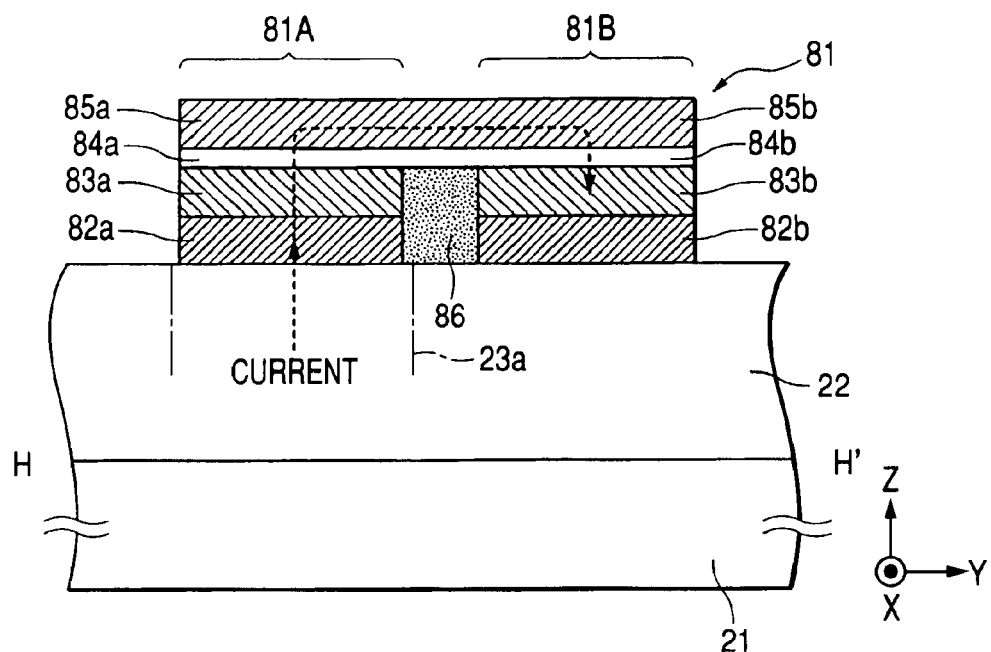
FIG. 23 is a schematic sectional view taken on line H–H' in FIG. 21.
Figure 24:
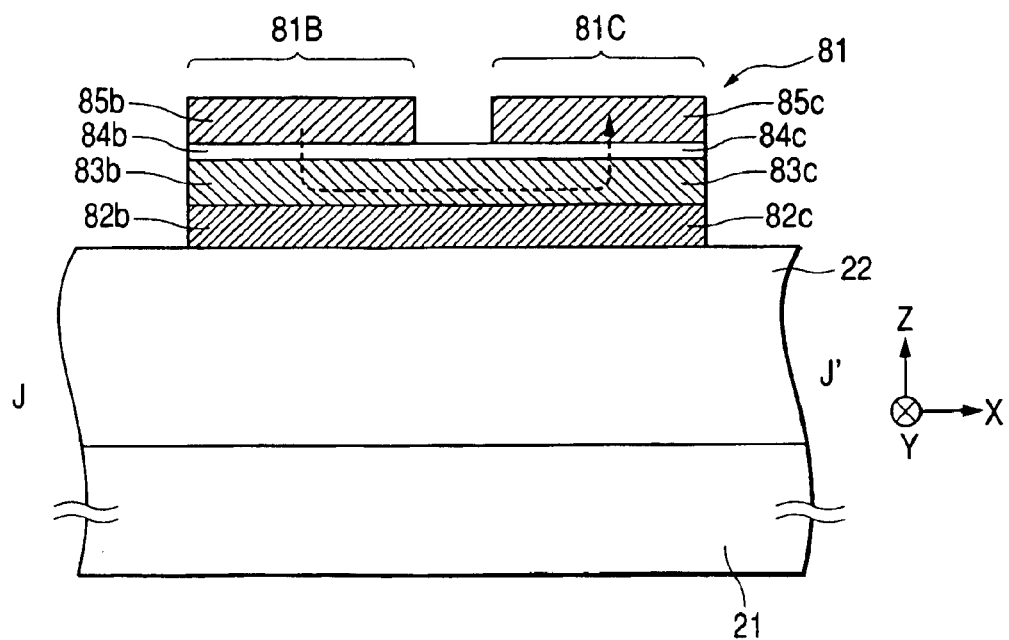
FIG. 24 is a schematic sectional view taken on line J–J' in FIG. 21.
Figure 25:
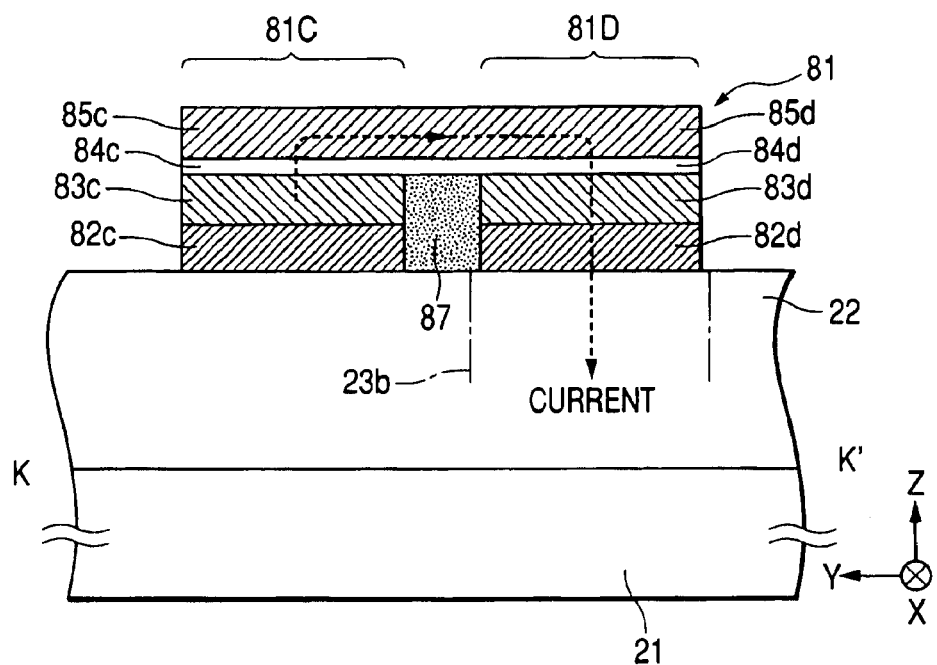
FIG. 25 is a schematic sectional view taken on line K–K' in FIG. 21.

FIG. 23 is a schematic sectional view taken on line H—H' in FIG. 21. FIG. 24 is a schematic sectional view taken on line J–J' in FIG. 21. FIG. 25 is a schematic sectional view taken on line K–K' in FIG. 21.

In this embodiment, the TMR element 81 has four TMR element portions 81A, 81B, 81C and 81D, which are laminated onto a layer 22 on a semiconductor substrate 21 individually. The TMR element portions 81A and 81B are disposed in the Y-axis direction with respect to each other. The TMR element portions 81B and 81C are disposed in the X-axis direction with respect to each other. The TMR element portions 81C and 81D are disposed in the Y-axis direction with respect to each other. The TMR element portions 81D and 81A are disposed in the X-axis direction with respect to each other.

The TMR element portion 81A is constituted by a laminate formed out of a pin layer 82a, a pinned layer 83a, a tunnel barrier layer 84a and a free layer 85a, which layers are laminated in order of increasing distance from the bottom. The TMR element portion 81B has the same layer structure as the TMR element portion 81A. That is, the TMR element portion 81B is constituted by a laminate formed out of a pin layer 82b, a pinned layer 83b, a tunnel barrier layer 84b and a free layer 85b, which layers are laminated in order of increasing distance from the bottom. The TMR element portion 81C has the same layer structure as the TMR element portion 81A. That is, the TMR element portion 81C is constituted by a laminate formed out of a pin layer 82c, a pinned layer 83c, a tunnel barrier layer 84c and a free layer 85c, which layers are laminated in order of increasing distance from the bottom. The TMR element portion 81D has the same layer structure as the TMR element portion 81A. That is, the TMR element portion 81D is constituted by a laminate formed out of a pin layer 82d, a pinned layer 83d, a tunnel barrier layer 84d and a free layer 85d, which layers are laminated in order of increasing distance from the bottom.

In this embodiment, as shown in FIGS. 21 to 25, an insulating layer 86 extending in the X-axis direction for separation is put between the pin layers 82a and 82b and between the pinned layers 83a and 83b so that the pin layers 82a and 82b and the pinned layers 83a and 83b are separated and electrically insulated from each other respectively. The free layers 85a and 85b are formed integrally out of one and the same material, so as to form one and the same continuous layer. The free layers 85b and 85c are separated and electrically insulated from each other. The pin layers 82b and 82c are formed integrally out of one and the same material, so as to form one and the same continuous layer. The pinned layers 83b and 83c are formed integrally out of one and the same material, so as to form one and the same continuous layer. An insulating layer 87 extending in the X-axis direction for separation is put between the pin layers 82c and 82d and between the pinned layers 83c and 83d so that the pin layers 82c and 82d and the pinned layers 83c and 83d are separated and electrically insulated from each other respectively. The free layers 85c and 85d are formed integrally out of one and the same material, so as to form one and the same continuous layer. The layers 82a to 85a are separated and electrically insulated from the layers 82d to 85d. Thus, the TMR element portions 81A, 81B, 81C and 81D are connected electrically in series so as to form an electric series connection body. Incidentally, the tunnel barrier layers 84a and 84b are formed integrally out of one and the same material so as to form one and the same continuous layer. The tunnel barrier layers 84b and 84c are formed integrally out of one and the same material so as to form one and the same continuous layer. The tunnel barrier layers 84c and 84d are formed integrally out of one and the same material so as to form one and the same continuous layer. The tunnel barrier layers 84a and 84d are separated from each other.

In this embodiment, a sensing current for detecting a change in magnetoresistance substantially flows in only through the pin layer 82a which is one end of the series connection body. The sensing current passes through the TMR element portions 81A, 81B, 81C and 81D in turn and then flows out only through the pin layer 82d which is the other end of the series connection body. Incidentally, not to say, the direction of the current may be reversed.

In this embodiment, the magnetization directions of the pinned layers 83a, 83b, 83c and 83d are set to be identical, for example, set to be aligned with the Y-axis direction.

Also according to this embodiment, advantages similar to those in the first embodiment can be obtained.

[Eighth Embodiment]

Figure 26:
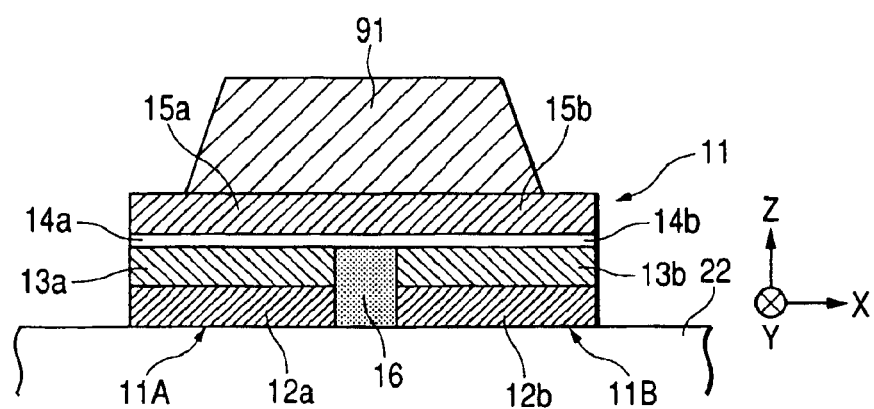
FIG. 26 is a schematic sectional view showing the relationship between a memory cell and a write line according to an eighth embodiment of the invention.

FIG. 26 is a schematic sectional view showing the relationship between a memory cell and a write line 91 according to an eighth embodiment of the invention.

In this embodiment, the TMR element 11 according to the first embodiment is used as the memory cell. Incidentally, the direction of the magnetization is set as shown in FIG. 6A or 6B. A write line 91 made from a conductor is added onto the free layers 15a and 15b formed integrally in the TMR element 11. The write line 91 extends in the Y-axis direction and forms a current magnetic field in the free layers 15a and 15b.

This write line 91 provides a current magnetic field for changing over the magnetization state of the two TMR element portions 11A and 11B of the TMR element 11 between a first state where all the resistance values of the TMR element portions 11A and 11B become large and a second state where all the resistance values become small.

In this embodiment, as shown in FIG. 26, the write line 91 is electrically connected to the free layers 15a and 15b. However, the write line 91 may be electrically insulated from the free layers 15a and 15b. For the sake of effective use of the current magnetic field formed by the write line 91, it is preferred that the write line 91 is electrically connected to the free layers 15a and 15b. However, when the write line 91 has to be insulated from circuits to be connected to the pin layers 12a and 12b, the write line 91 is brought into insulated contact with the free layers 15a and 15b. In this case, the operation for setting the magnetization direction in the free layers 15a and 15b and the operation for detecting the MR (Magneto-Resistance) can be performed concurrently.

Figure 27:
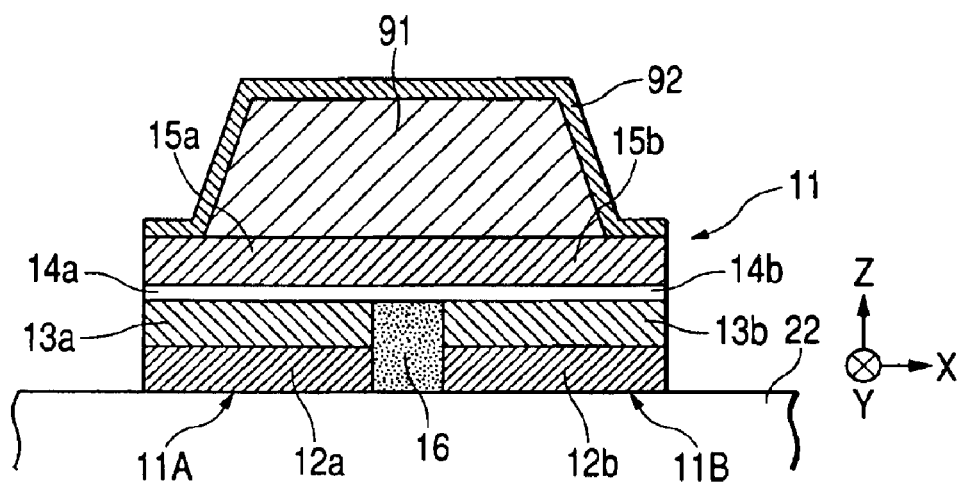
FIG. 27 is a schematic sectional view showing a modification of the eighth embodiment.

FIG. 27 is a schematic sectional view showing a modification of the eighth embodiment. The modification shown in FIG. 27 is the same as the eighth embodiment, except that a magnetic circuit forming layer 92 for guiding the current magnetic field generated by the write line 91 into the free layers 15a and 15b is added. The magnetic circuit forming layer 92 is formed on and around the write line 91 so as to form a magnetic yoke. In the example shown in FIG. 27, the write line 91 is electrically connected to the magnetic circuit forming layer 92. However, the write line 91 may be insulated from the magnetic circuit forming layer 92 in the same manner as described previously.

In addition, in the example shown in FIG. 27, the magnetic circuit forming layer 92 comes in contact with the free layers 15a and 15b so as to form a closed magnetic circuit. However, as shown in FIG. 28, the magnetic circuit forming layer 92 may not be always in contact with the free layers.

Figure 28:
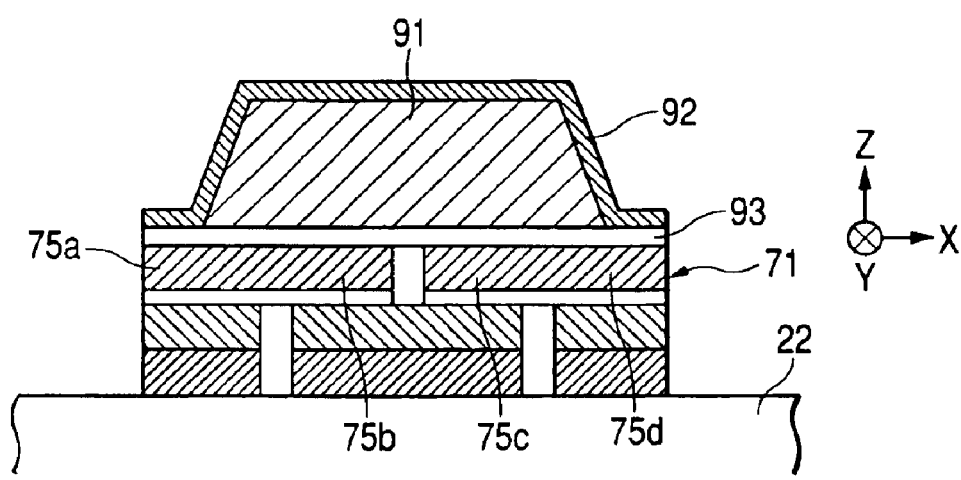
FIG. 28 is a schematic sectional view showing another modification of the eighth embodiment.

In the example shown in FIG. 28, the TMR element 71 shown in FIGS. 18 and 19 is used in place of the TMR element 11. In the example shown in FIG. 28, an insulating layer 93 is formed between each free layer and each of the magnetic circuit forming layer 92 and the write line 91 so as to keep an electrically insulated state between the free layer 75b and the free layer 75c.

[Ninth Embodiment]

Figure 29:
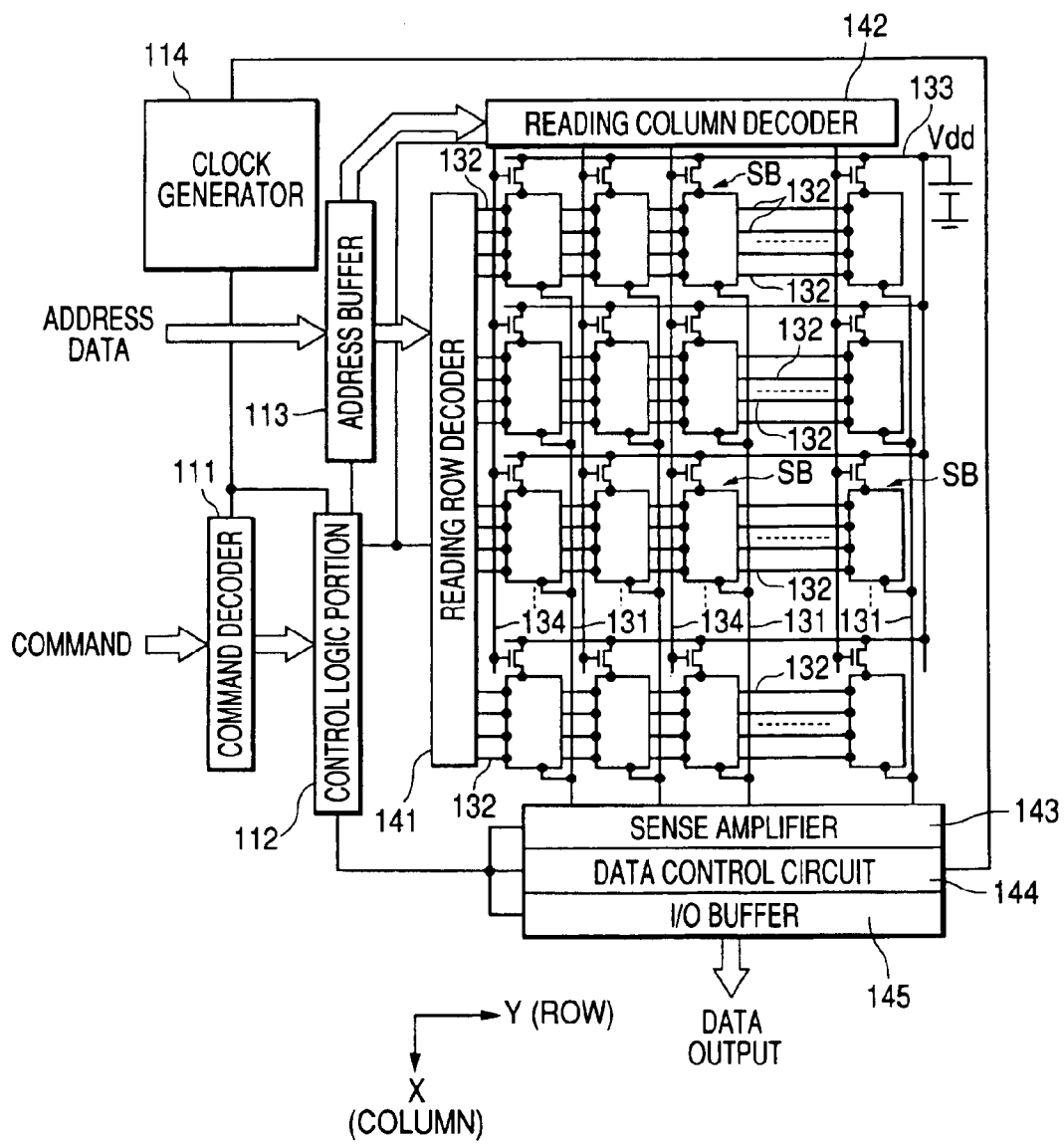
FIG. 29 is a schematic configuration diagram showing a data reading configuration of a memory device according to a ninth embodiment of the invention.
Figure 30:
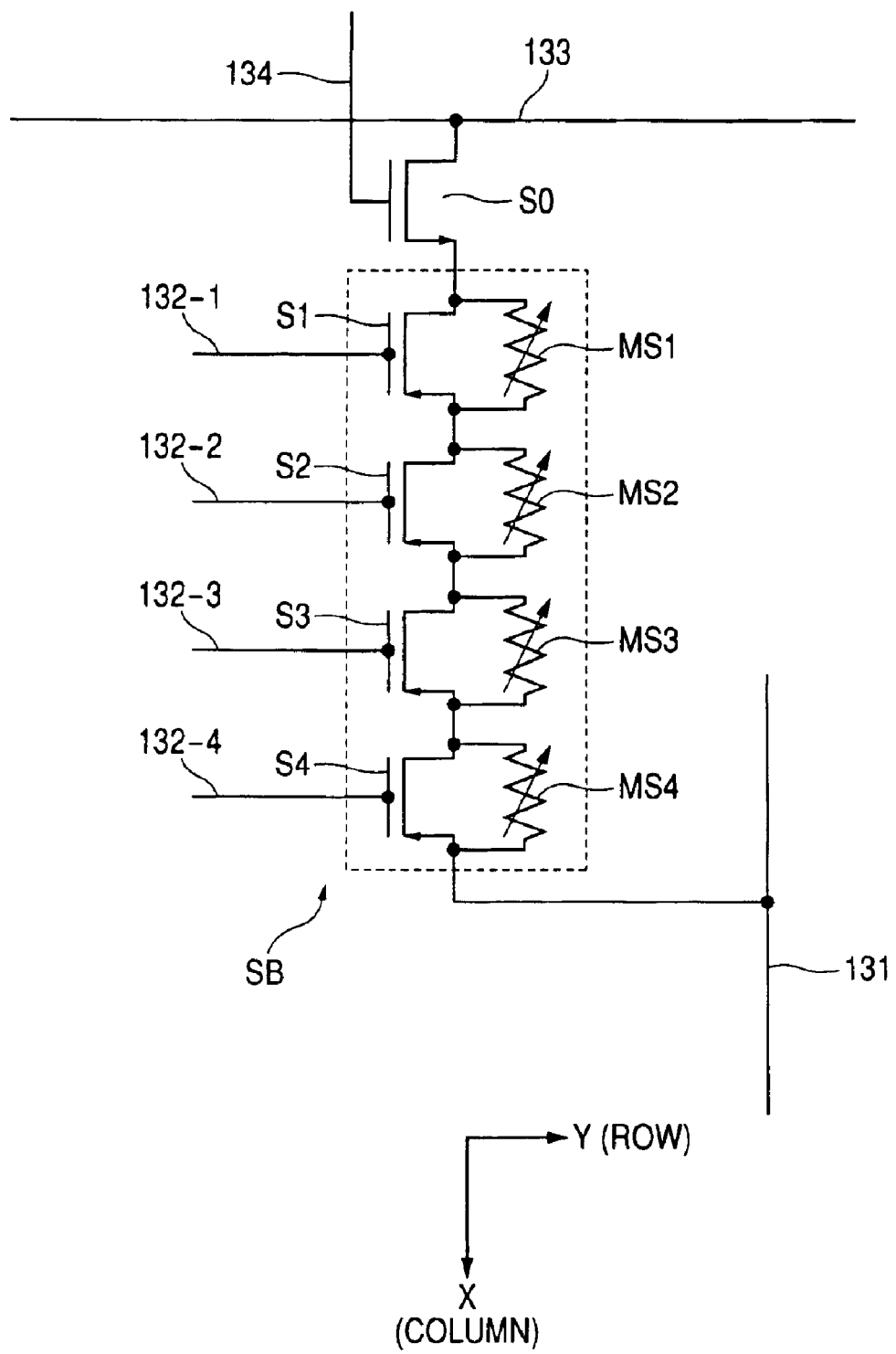
FIG. 30 is a circuit diagram showing one block serving as a fundamental unit constituting a data reading circuit of the memory device according to the ninth embodiment of the invention.
Figure 31:
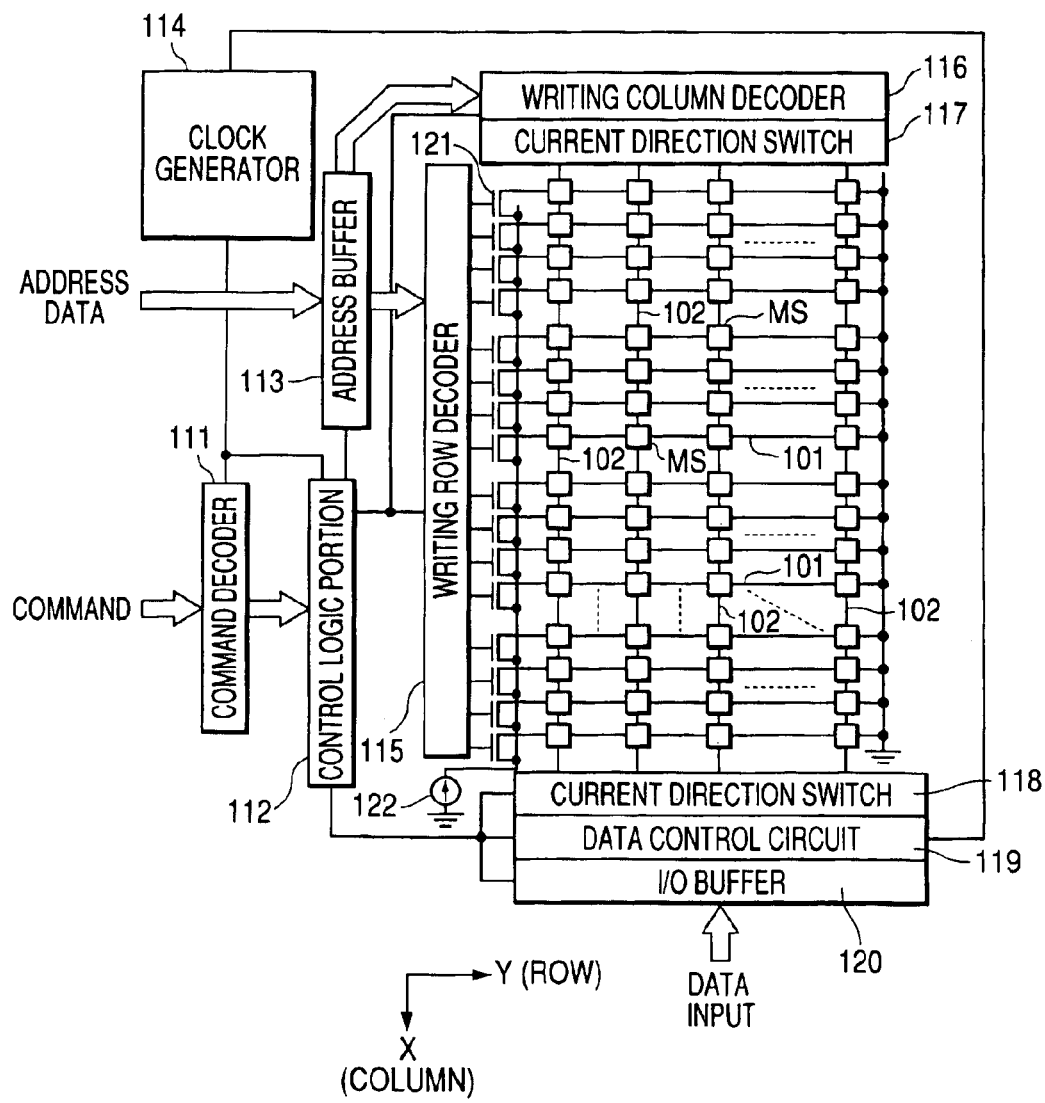
FIG. 31 is a diagram showing a data writing configuration of the memory device according to the ninth embodiment of the invention.
Figure 32:
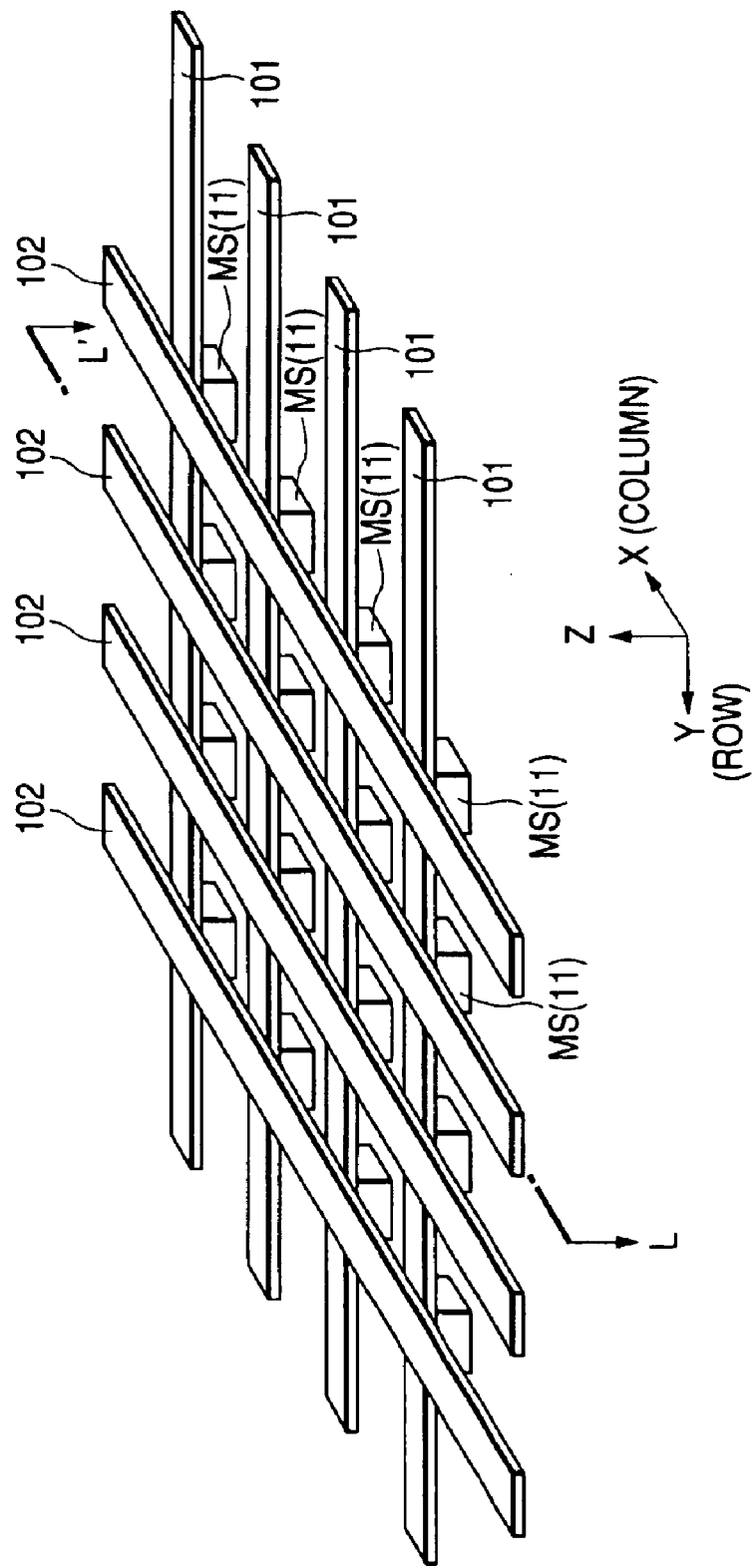
FIG. 32 is a schematic perspective view schematically showing the positional relationship between memory cells and write lines in the memory device according to the ninth embodiment of the invention.
Figure 33:
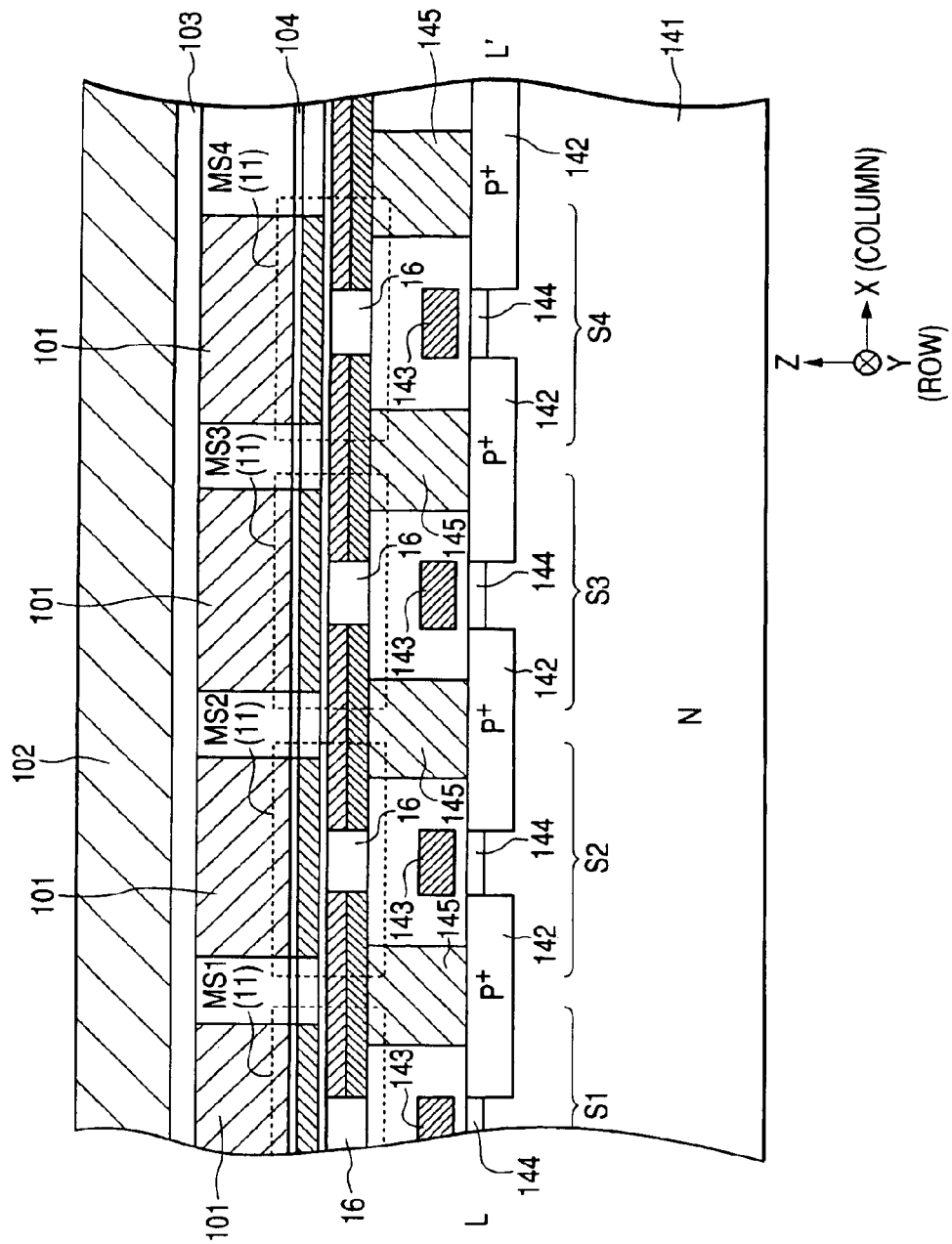
FIG. 33 is a schematic sectional view taken on line L–L' in FIG. 32.

FIG. 29 is a schematic configuration diagram showing a data reading configuration of a memory device according to a ninth embodiment of the invention. FIG. 30 is a circuit diagram showing one block SB serving as a fundamental unit constituting a data reading circuit of the memory device according to the ninth embodiment of the invention. FIG. 31 is a diagram showing a data writing configuration of the memory device according to the ninth embodiment of the invention. FIG. 32 is a schematic perspective view schematically showing the positional relationship between memory cells and write lines in the memory device according to the ninth embodiment of the invention. Incidentally, in FIG. 32, in order to make the embodiment understood easily, the respective memory cells are illustrated as if they are not connected with one another. In fact the memory cells are connected as shown in FIG. 33. FIG. 33 is a schematic sectional view taken on line L–L' in FIG. 32.

The memory device according to this embodiment is formed as MRAM.

In this embodiment, as shown in FIG. 32, the memory device includes a plurality of first write lines (write word lines) 101 extending in the Y-axis direction (row direction), a plurality of second write lines (write bit lines) 102 extending in the X-axis direction (column direction) and above the first write lines 101, and memory cells MS disposed under the second write lines 102 and at the crossing points of the first and second write lines 101 and 102 respectively. This state is also shown schematically in FIG. 31. In such a manner, in this embodiment, two write lines 101 and 102 are disposed for each memory cell MS.

Each write line 101, 102 is formed out of a conductor. As shown in FIG. 33, each write line 101 and each write line 102 are electrically insulated from each other through an insulating layer 103 formed therebetween.

Particularly as is observed from FIG. 33, in this embodiment, the TMR element 11 according to the first embodiment shown in FIGS. 1 and 2 is used as each memory cell MS. Incidentally, in FIG. 33, the signs "MS" are numbered for identifying individual memory cells (the same thing is applied to FIG. 30 which will be described later).

The free layer at the top of each memory cell MS (TMR element 11) and a corresponding lower write line 101 are electrically insulated from each other through an insulating layer 104 formed therebetween. Incidentally, without providing the insulating layer 104, the free layer and the corresponding lower write line 101 may be electrically connected with each other.

As is observed from FIG. 33, when currents are supplied to the two write lines 101 and 102 crossing on one memory cell MS (TMR element 11), a combined magnetic field generated by the write lines 101 and 102 can change over the magnetization states (the magnetization directions of the free layers 15a and 15b formed integrally) of the two TMR element portions 11A and 11B (not shown in FIG. 33, but see FIG. 1) of the memory cell MS (TMR element 11) in a lump.

Here, the configuration and operation for writing data will be described with reference to FIG. 31.

One end of each first write line 101 is connected to one end of a row selection switch 121 made of a MOSFET or the like. The other end of each row selection switch 121 is connected to a constant current source 122. The gate of each selection switch 121 is connected to a writing row decoder 115 which will be described later. The other end of each first write line 101 is grounded.

One end of each write line 102 is connected to a current direction switch 117 which will be described later. The other end of each write line 102 is connected to a current direction switch 118 which will be described later.

In addition, as shown in FIG. 31, the memory device according to this embodiment includes a command decoder 111, a control logic portion 112, an address buffer 113, a clock generator 114, the writing row decoder 115, a writing column decoder 116, the current direction switches 117 and 118, a data control circuit 119 and an I/O buffer 120 for input data.

The command decoder 111 identifies a command (an instruction to write or read, or the like) from the outside, and supplies the identification result to the control logic portion 112.

Under the control of the control logic portion 112, the address buffer 113 receives address data (indicating the place where data is stored) from the outside, and divides the address data into a row-direction address and a column-direction address. At the time of writing data, the address buffer 113 supplies the row-direction and column-direction addresses to the writing row decoder 115 and the writing column decoder 116 respectively.

The writing row decoder 115 turns on the row selection switch 121 in a row corresponding to the address supplied from the address buffer 113 so as to supply a current from the constant current source 122 to the write line 101 in the row.

The writing column decoder 116 selects the column write line 102 in a column corresponding to the address supplied from the address buffer 113, and actuates the current direction switch 117 so as to allow a current to flow into the write line 102 in the column.

Under the control of the control logic portion 112, the I/O buffer 120 temporarily accumulates input data and supplies the input data to the data control circuit 119 at a proper timing. The data control circuit 119 controls the current direction switches 117 and 118 so that the direction of the current flowing through the write line 102 corresponds to the data to be written, and supplies a drive current to flow into the write line 102.

Incidentally, the clock generator 114 supplies each circuit part with a clock required for its operation.

As soon as an instruction to write data is given by an command from the outside, by the operations of the respective parts described above, currents flow into the two write lines 101 and 102 on the memory cell MS corresponding to the address data from the outside, and the direction of the current flowing through the write line 102 is set in accordance with the data to be written. By a combined current magnetic field of the currents, the magnetization direction of the free layers of the memory cell MS (TMR element 11) is set, and the data is written in the memory cell MS.

In this embodiment, the write lines 101 and 102 are electrically insulated from the memory cell MS as described previously. Accordingly, the operation to write data and the operation to read data can be performed desirably and independently of each other. In addition, due to the structure in which the write line 101 and the write line 102 cross each other on the memory cell MS, an operation quite the same as an NOR circuit can be performed. Thus, high-speed random access can be attained.

Although writing into memory cells MS may be performed sequentially one by one, writing into a plurality of memory cells MS can be performed concurrently as follows. That is, a constant current is supplied to one write line 101. In addition, a current is supplied to a plurality of write lines 102 simultaneously. Thus, data can be concurrently written into memory cells MS at the points where the write line 101 crosses the write lines 102.

Next, description will be made on the data reading configuration of the memory device according to this embodiment.

In this embodiment, one block SB shown in FIG. 30 is used as a fundamental unit constituting a data reading circuit. One block SB is constituted by four memory cells MS1 to MS4 connected electrically in series, p-MOSFETs S1 to S4 serving as four switching elements connected in parallel with the memory cells MS1 to MS4 in one-to-one correspondence, and an n-MOSFET S0 serving as a selection switch whose one end is connected to one of series connection ends of the memory cells MS1 to MS4.

Incidentally, in FIG. 30, each memory cell MS1–MS4 is shown as one variable resistor. In fact, each memory cell is a series connection body of two variable resistors as shown in FIG. 4.

The other series connection end of the memory cells MS1 to MS4 is connected to a read line 131. The gates of the p-MOSFETs S1 to S4 serving as their control input portions are connected to first read selection lines (reading bit lines) 132-1 to 132-4 respectively. The other end of the n-MOSFET S0 is connected to a power supply line 133. The gate of the n-MOSFET S0 serving as its control input portion is connected to a second read selection line (reading word line) 134.

Incidentally, the number of sets of memory cells MS and switching elements (FETs in this embodiment) in one block SB, the switching elements being connected in parallel with the memory cells MS respectively, are not limited to four. There is no limit in the number of the sets.

FIG. 33 shows a sectional structure of a part of the block SB. In this embodiment, the memory cells MS1 to MS4 are connected in series by forming pin layers and pinned layers of adjacent two memory cells MS integrally out of one and the same material respectively.

In addition, as shown in FIG. 33, the drain/source region of each p-MOSFET S1–S4 is constituted by a P+ region 142 formed on an N-type silicon substrate 141. Each P+ region 142 extends continuously over adjacent FETs so that the series connection among the p-MOSFETs S1 to S4 can be attained without using any special wiring layer.

In FIG. 33, the reference numeral 143 represents a gate of each p-MOSFET S1–S4, and 144 represents a channel region of each p-MOSFET S1–S4. The gate 143 is made from polysilicon.

Then, the parallel connection between each memory cell MS1–MS4 and each p-MOSFET S1–S4 is performed through a connection via 145 disposed between the upper surface of the p+ region 142 and the lower surface of the pin layer of the memory cell MS as shown in FIG. 33.

Here, description will be made on the reading operation of the block SB in FIG. 30. When this block SB is not selected, that is, when an L signal is applied to the read selection line 134, the n-MOSFET S0 is OFF. Thus, no current flows from this block SB into the read line 131.

When an H signal is applied to the read selection line 134, the n-MOSFET S0 is turned ON, power is supplied from the power supply line 133 to the column of the memory cells MS1 to MS4. In this event, the H signal is applied to only one of the read selection lines 132-1 to 132-4 while the L signal is applied to the other read selection lines. Then, of the p-MOSFETs S1 to S4, only the FET whose gate is applied with the H signal becomes OFF, while the other FETs become ON. As a result, a current from the power supply passes through only one of the memory cells MS1 to MS4 connected in parallel with the FET turned OFF, and passes not through the other memory cells but through the p-MOSFETs connected in parallel with the other memory cells. Then, the current is outputted from the read line 131. Thus, a sensing current (a read current corresponding to the resistance value of the memory cell MS) of a desired memory cell MS selected from the memory cells MS1 to MS4 can be obtained from the read line 131.

As shown in FIG. 29, such blocks SB shown in FIG. 30 are disposed in a two-dimensional matrix so as to extend in a row direction (Y-axis direction) and a column direction (X-axis direction), while four memory cells MS of each block SB are disposed in the column direction (X-axis direction). Incidentally, the portion enclosed with the broken line in FIG. 30 is illustrated by the rectangular solid line in FIG. 29 for the sake of convenience of drawing notation.

The gates of the p-MOSFETs S1 to S4 of the blocks SB are connected through a plurality of read selection lines 132 in respective rows so that each read selection line 132 is shared among the gates in a row corresponding to the read selection line 132. That is, each read selection line 132-1 to 132-4 is connected to be shared in its corresponding row so as to serve as the read selection line 132 for the row. Although each read selection line 132 is depicted to be intermittent in FIG. 29, it is continuous in fact. Practically, the gates 143 of the p-MOSFETs S1 to S4 in FIG. 33 extend continuously in the Y-axis direction as they are, so as to form the read selection lines 132. As shown in FIG. 29, the read selection lines 132 are connected to the reading row decoder 141 which will be described later.

In addition, each read line 131 connected to the blocks SB in its corresponding column are connected to be shared in the column as shown in FIG. 29. The end portion of each read line 131 opposite to the blocks SB is connected to a sense amplifier 143 which will be described later.

Each read selection line 134 connected to the blocks in its corresponding column is connected to be shared in the column. Each read selection line 134 is connected to a reading column decoder 142 which will be described later.

As shown in FIG. 29, the memory device according to this embodiment includes the reading row decoder 141, the reading column decoder 142, the sense amplifier 143, a data control circuit 144 and an I/O buffer 145 for output data.

Incidentally, the command decoder 111, the control logic portion 112, the address buffer 113 and the clock generator 114 described previously as parts of the data reading configuration also take part in the reading operation. Therefore, those parts are shown in FIG. 29 again.

Under the control of the control logic portion 112, the address buffer 113 receives address data (indicating the place where data is stored) from the outside, and divides the address data into a row-direction address and a column-direction address. At the time of reading data, the address buffer 113 reads the row-direction and column-direction addresses and supplies them to the reading row decoder 141 and the reading column decoder 142 respectively.

The reading row decoder 141 gives an L signal or an H signal to each read selection line 132 in each row in accordance with the address supplied from the address buffer 113 so as to select a row of a memory cell MS to be read.

The reading column decoder 142 gives an L signal or an H signal to each read selection line 134 in each column in accordance with the address supplied from the address buffer 113 so as to select a column of the memory cell MS to be read.

The sense amplifier 143 amplifies a sensing current obtained from the read line 131. The data control circuit 144 converts the amplified sensing current into a logical voltage, and writes the converted logical voltage into the I/O buffer 145 as read data.

Under the control of the control logic portion 112, the I/O buffer 145 temporarily accumulates the data written by the data control circuit 144 and supplies the data to the outside at a proper timing.

As soon as an instruction to read data is given by an command from the outside, by the operations of the respective parts described above, data stored in a memory cell MS corresponding to address data from the outside is read out as a sensing current, which is converted into data. The data is outputted to the outside.

Although data may be read from memory cells MS sequentially one by one, concurrent access to data on a plurality of read selection lines 134 crossing one read selection line 132 can be performed to extract the data from a plurality of memory cells MS.

Incidentally, though not shown, each component in FIGS. 29 and 31 described previously is mounted on the substrate 141 shown in FIG. 33.

In this embodiment, the TMR element 11 according to the first embodiment is used as each memory cell MS. The lowering of the MR ratio caused by the voltage bias characteristic is reduced in the TMR element 11, so that the MR ratio of the TMR element 11 is improved. Therefore, according to this embodiment, the S/N ratio of a read signal is improved so that the reliability in reading data can be enhanced.

Figure 41:
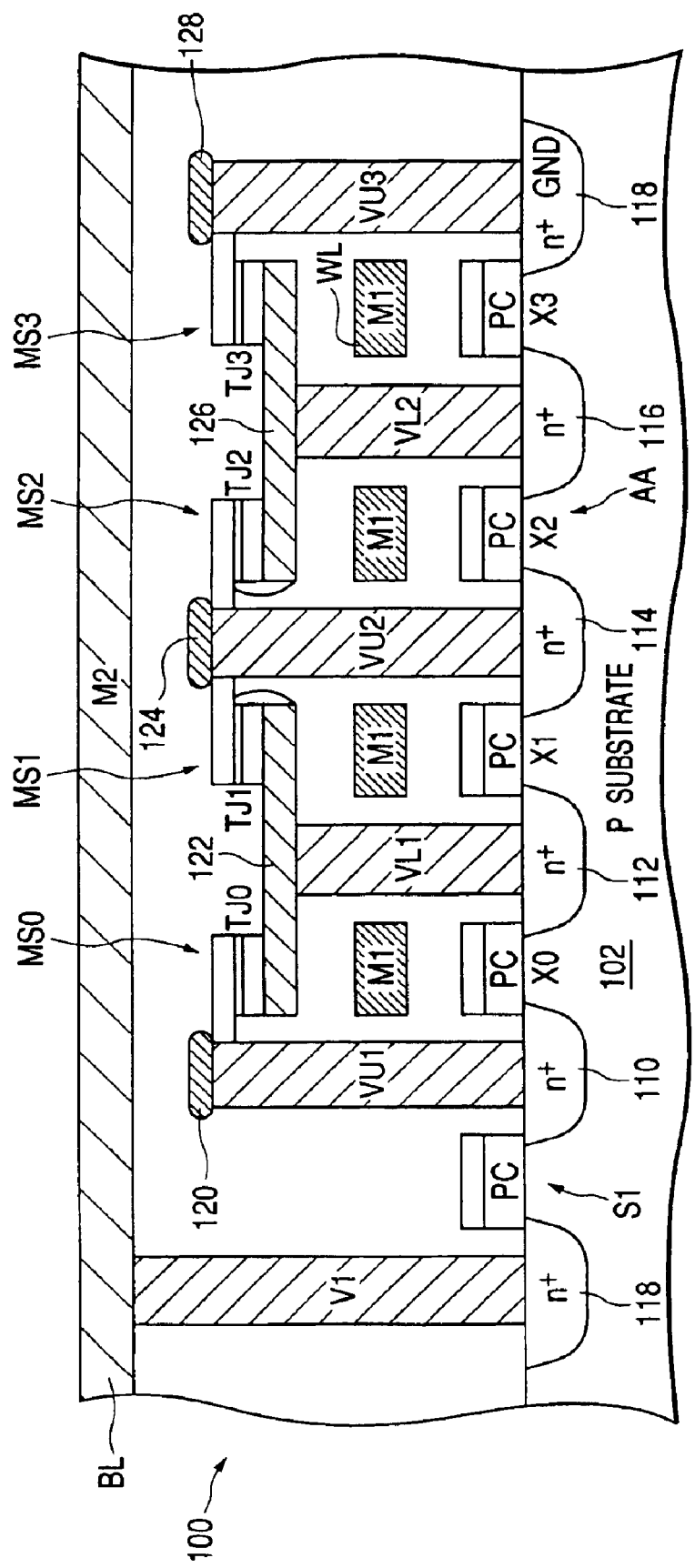
FIG. 41 is a sectional view showing the structure of the MRAM in the second conventional example.

In addition, in this embodiment, as shown in FIG. 33, both the current input and output terminals of the TMR element 11 used as the memory cell MS are located on the substrate 141 side. Accordingly, the height of the connection via 145 can be reduced so that the number of layers spanned by the connection via 145 can be reduced. This point will be obvious when the connection via 145 is compared with the via VU1, VU2 or VU3 in FIG. 41. Therefore, according to this embodiment, it is not necessary to form any via spanning a large number of layers. Thus, the manufacturing process becomes easy.

Figure 39:
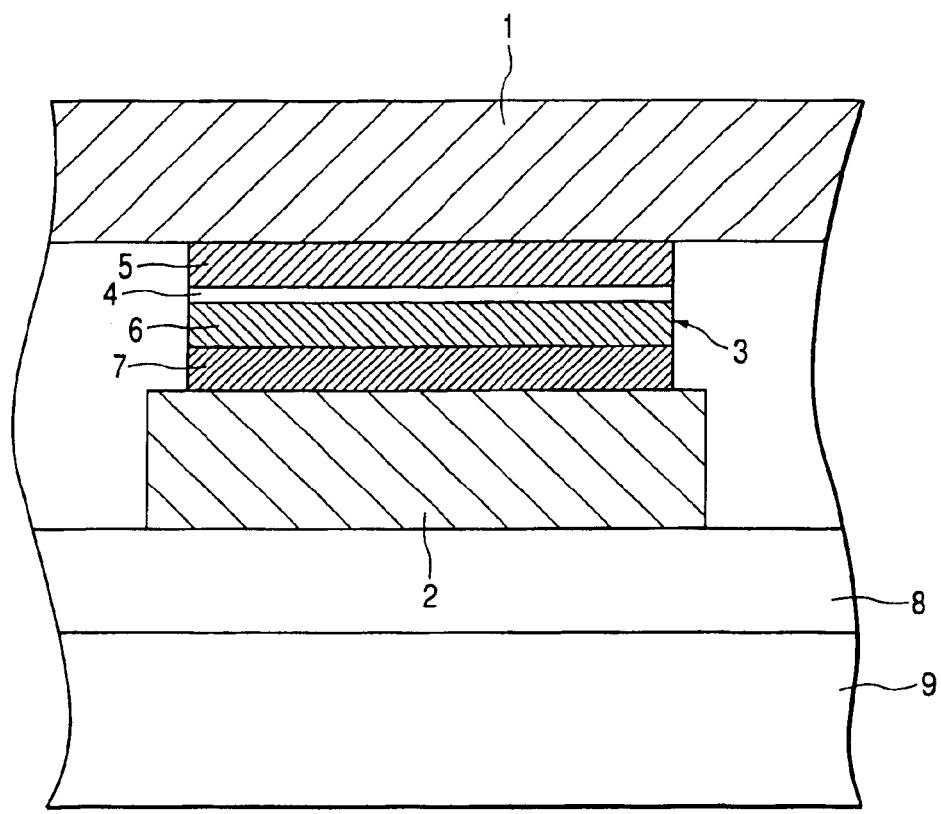
FIG. 39 is a schematic sectional view showing the vicinity of one memory cell of an MRAM in a first conventional example.
Figure 40:
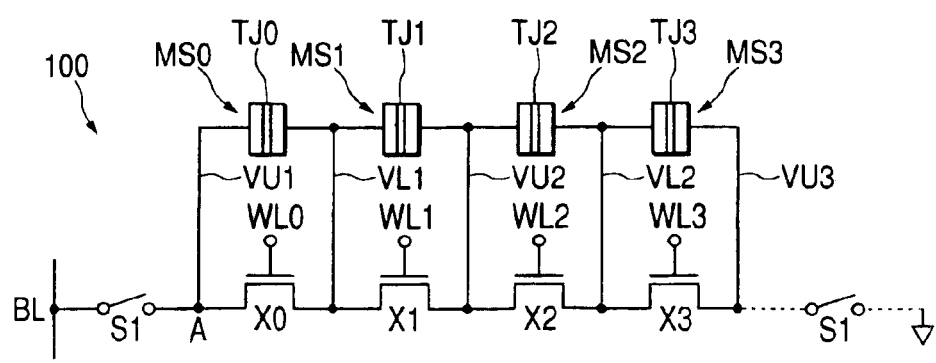
FIG. 40 is a circuit diagram showing a reading circuit of an MRAM in a second conventional example.

In addition, according to this embodiment, each write line 101 and each write line 102 are electrically insulated from each other as described previously. On the other hand, in the first conventional example shown in FIG. 39, the upper conductor wire 1 and the lower conductor wire 2 are electrically connected with each other through the TMR element 3 so that a very small current flows through the TMR element 3 lying between the upper conductor wire 1 and the lower conductor wire 2 when a slight voltage is generated between the upper conductor wire 1 and the lower conductor wire 2. Further, a memory device is constituted by a combination of ten thousands of memory cells or more. Thus, the very small current grows up. As a result, a current value for writing may differ from one memory cell to another depending on the location. On the other hand, in this embodiment, it is possible to supply a constant and equal writing current to each memory cell because the write lines 101 and 102 are insulated from each other.

In addition, a current for detecting the magnetoresistance of the TMR element can be supplied independently of a data writing current (which is supplied to wiring on the free layers so that the magnetization directions of the free layers are changed due to a current magnetic field generated by the current). Accordingly, when MRAM is constituted by TMR elements according to the invention, the operation to write data and the operation to read data can be performed concurrently so that the memory operation can be made efficiently.

Further, in this embodiment, the write lines 101 and 102 are disposed above the memory cells MS. Accordingly, TMR elements are formed on an IC substrate in the first place. Generally, to form a TMR element, a substrate under the TMR element has to have an extremely high flatness for the following reason. Of the layers of the TMR element, particularly the tunnel barrier layer is about 10 nm in thickness or thinner. Thus, it is difficult to form the tunnel barrier layer uniform. It is therefore necessary to use CMP or the like to make the substrate flat with roughness of about 1 nm. However, when there is a conductor pattern (whose thickness is in an order of 100 nm) etc. in the substrate as in the background art, irregularities are so conspicuous that a lot of trouble and a large number of steps are required for flattening their regularities. However, when the lowermost layer has a surface which has been already flattened sufficiently or a surface low in roughness, a surface having an extremely high flatness can be formed easily. It is therefore also possible to make the TMR element forming process easy.

In this embodiment, the TMR element 11 according to the first embodiment is used as each memory cell MS. However, in this invention, any one of the TMR elements 31, 41, 51, 61, 71 and 81 according to the other embodiments described previously may be used as each memory cell MS in a memory device similar to that in this embodiment. Particularly when the TMR element 71 or 81 is used as each memory cell MS in place of the TMR element 11, it is hardly necessary to modify the memory device according to this embodiment. In addition, all the advantages in this embodiment can be obtained.

[Tenth Embodiment]

Figure 34:
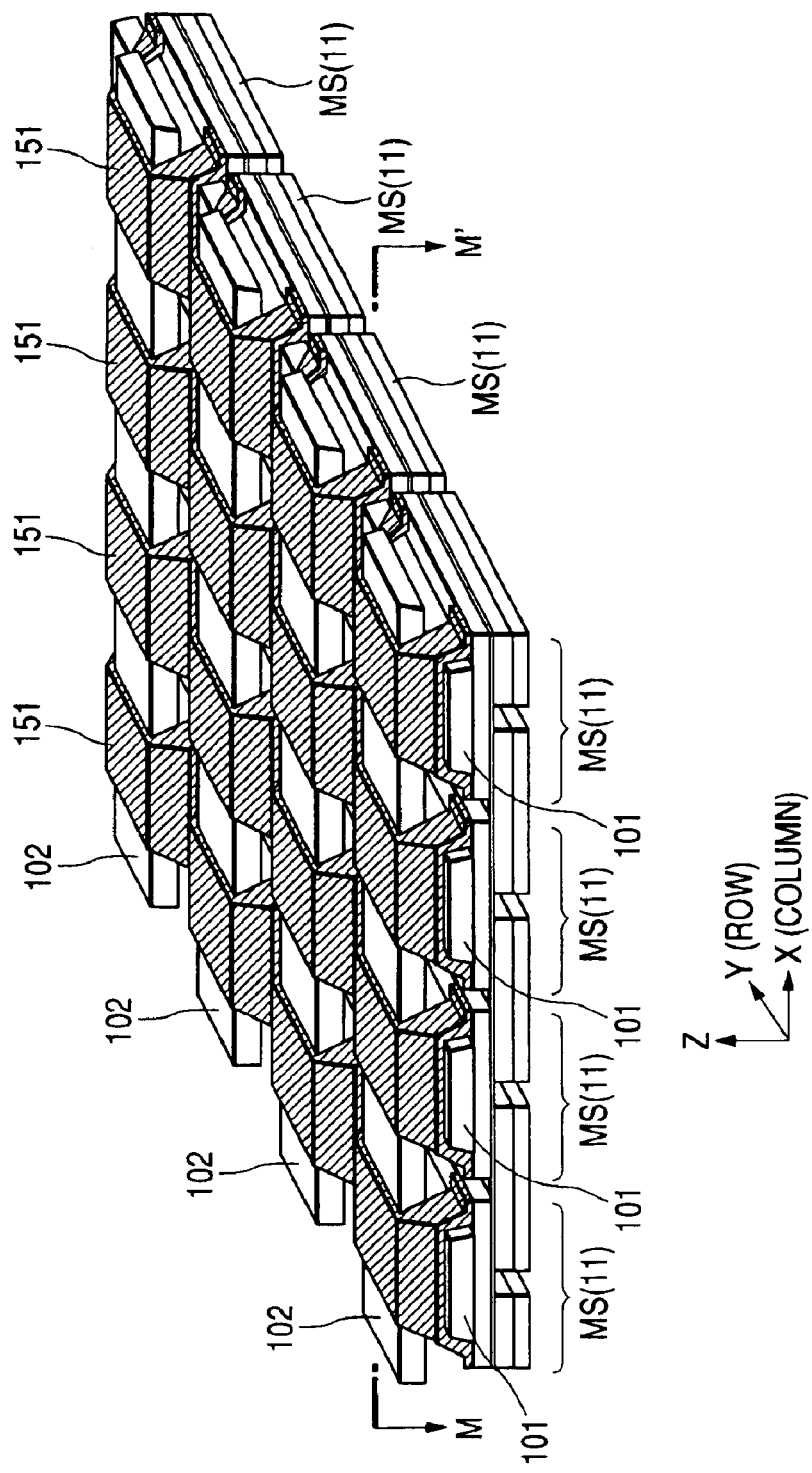
FIG. 34 is a schematic perspective view showing a main portion of a memory device according to a tenth embodiment of the invention.
Figure 35:
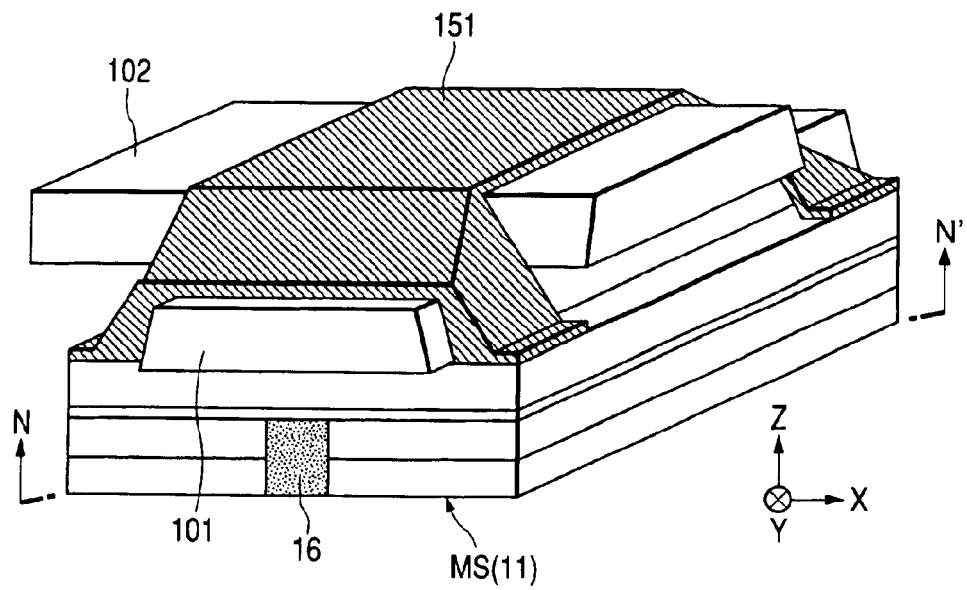
FIG. 35 is a schematic perspective enlarged view of the vicinity of one memory cell in FIG. 34.
Figure 36:
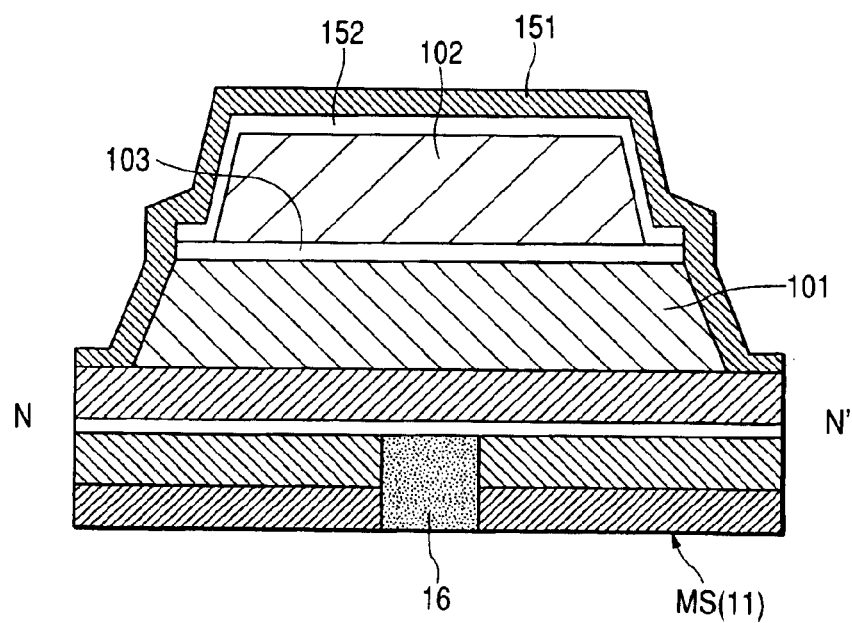
FIG. 36 is a schematic sectional view taken on line N–N' in FIG. 35.

FIG. 34 is a schematic perspective view showing a main portion of a memory device according to a tenth embodiment of the invention, correspondingly to FIG. 32. The schematic sectional view taken on line M–M' in FIG. 34 is similar to FIG. 33. FIG. 35 is a schematic perspective enlarged view of the vicinity of one memory cell MS in FIG. 34. FIG. 36 is a schematic sectional view taken on line N–N' in FIG. 35.

This embodiment is the same as the ninth embodiment, except that there is added a magnetic circuit forming layer 151 by which a combined current magnetic field generated by the write lines 101 and 102 is guided into the free layers of the memory cell MS in the vicinities of the four corners of a crossing portion of the write lines 101 and 102, and that no insulating layer is provided between the free layers of the memory cell MS and the write line 101.

The magnetic circuit forming layer 151 is provided in the vicinity of the crossing point of the write lines 101 and 102 and from above the write lines 101 and 102, so as to form a magnetic yoke. The magnetic circuit forming layer 151 is connected to the free layers in the four corners of the crossing portion of the write lines 101 and 102. Incidentally, the reference numeral 152 in FIG. 36 represents an insulating layer.

According to this embodiment, a current magnetic field generated by the write lines 101 and 102 can be applied to the free layers of the memory cell MS (TMR element 11) efficiently by the magnetic circuit forming layer 151. Accordingly, in comparison with the case where no magnetic circuit forming layer 151 is provided, currents to be supplied to the write lines 101 and 102 can be reduced so that current consumption for writing data can be saved. In addition, there is a magnetic shield effect against an external magnetic influence.

Further, the magnetic circuit forming layer 151 and the free layers are connected in the four corners of the portion where the write lines 101 and 102 make right angles. Accordingly, in accordance with a combined current magnetic field generated by the write lines 101 and 102, a magnetic field effective in rewriting enters the free layers only when the combined magnetic field has an angle of about 45 degrees. Thus, the magnetization direction of the free layers can be rewritten. In a background art structure in which a current magnetic field is formed in a space, there may occur an error (partial write) that the magnetization direction of a free layer of a TMR element is changed by a current magnetic field generated by only one of word and bit data write lines. However, in this embodiment, the magnetic yoke does not have a closed magnetic circuit structure with respect to the direction of a current magnetic field formed in one of the word and bit data write lines (the direction perpendicular to the line). Accordingly, such a magnetic field cannot be high enough to change the magnetization direction of the free layer. Thus, it is possible to increase a margin for such an error.

Incidentally, in this embodiment, the magnetic circuit forming layer 151 formed on the top of each memory cell MS is separated from others on the other memory cells MS. However, when an oxide magnetic material such as ferrite is deposited by sputtering or wet plating, each magnetic circuit forming layer 151 does not have an individual pattern, but may be deposited all over the area where TMR elements have been formed.

[Other Embodiments]

Magnetoresistive effect elements according to the invention, for example, the TMR elements 11, 31, 41, 51, 61, 71 and 81 according to the first to seventh embodiments can be used not only for memory devices but also for elements (sensor elements) for detecting a low magnetic field from the magnetic sensor free layer side. In this case, it is preferable to use a soft magnetic material as the material of the free layer.

Figure 37:
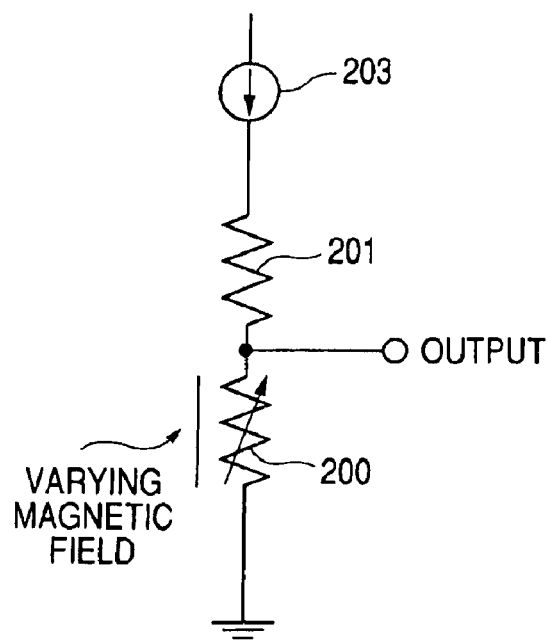
FIG. 37 is a circuit diagram showing a device according to another embodiment of the invention.
Figure 38:
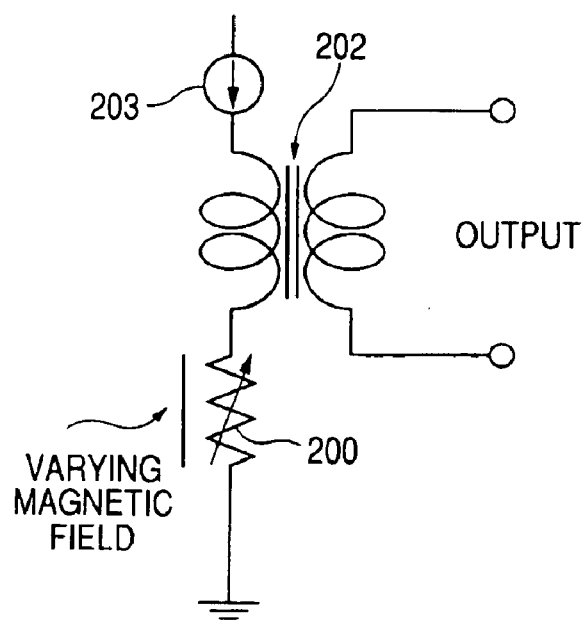
FIG. 38 is a circuit diagram showing a device according to further another embodiment of the invention.

In this event, a varying magnetic field is detected on the free layer side, and a constant current is supplied between the two pinned layers. Thus, the magnetic field can be detected as a change in voltage by a circuit shown in FIG. 37 or a circuit shown in FIG. 38. In FIGS. 37 and 38, the reference numeral 200 represents a magnetoresistive effect element according to the invention; 201, a resistor; 202, a transformer; and 203, a constant current source.

Accordingly, the magnetoresistive effect element is also applicable as a magnetic sensor element. Also in this case, the magnetoresistive effect element according to the invention can be formed on an IC for amplifying a detected signal. Thus, similar effects can be obtained.

Although the respective embodiments of the invention have been described above, the invention is not limited to the embodiments. For example, the magnetoresistive effect element according to the invention can be also used in a magnetic head of HDD or the like.

As described above, according to the invention, it is possible to provide a memory device in which the memory capacity can be increased, while the reliability in reading data can be enhanced.

In addition, according to the invention, it is possible to provide a memory device in which the memory capacity can be increased, the reliability in reading data can be enhanced, and the manufacturing process involved in electric connections of input and output terminals of magnetoresistive effect elements can be made easy.

In addition, according to the invention, it is possible to provide a magnetoresistive effect element in which the lowering of the MR radio caused by the voltage bias characteristic can be improved, and a memory device using the magnetoresistive effect element.

In addition, according to the invention, it is possible to provide a magnetoresistive effect element in which the manufacturing process involved in electric connections of input and output terminals of the magnetoresistive effect element can be made easy, and a memory device using the magnetoresistive effect element.

What is claimed is:

1. A memory device comprising:
   a plurality of memory cells connected electrically in series; and
   a plurality of switching elements connected in parallel with said memory cells in one-to-one correspondence;
   wherein each of said memory cells is comprised of a magnetoresistive effect element having a plurality of magnetoresistive effect element portions;
   wherein said magnetoresistive effect elements are laminated on one surface side of a substrate and disposed in a direction parallel to laminated surfaces of said magnetoresistive effect elements with respect to one another;
   wherein said magnetoresistive effect element portions in each of said magnetoresistive effect elements are electrically connected in series so as to form an electric series connection body;
   wherein opposite ends of said series connection body in each of said magnetoresistive effect elements are electrically connected to a sensing current supply portion so that a sensing current for detecting a change in magnetoresistance flows in through one end of said series connection body, passes in turn through effective areas effective in changing magnetoresistance in each of said magnetoresistive effect element portions so as to penetrate said laminated surfaces, and flows out through the other end of said series connection body; and
   wherein each of said switching elements switches on/off between said one end and said other end of said series connection body of said magnetoresistive effect element connected in parallel with said switching element, in accordance with a signal inputted into a control input portion of said switching element.

2. A memory device comprising:
a plurality of blocks arrayed;
wherein each of said blocks includes a plurality of memory cells connected electrically in series, and a plurality of switching elements connected in parallel with said memory cells in one-to-one correspondence;
wherein each of said memory cells is comprised of a magnetoresistive effect element having a plurality of magnetoresistive effect element portions;
wherein said magnetoresistive effect elements are laminated on one surface side of a substrate and disposed in a direction parallel to laminated surfaces of said magnetoresistive effect elements with respect to one another;
wherein said magnetoresistive effect element portions in each of said magnetoresistive effect elements are electrically connected in series so as to form an electric series connection body;
wherein opposite ends of said series connection body in each of said magnetoresistive effect elements are electrically connected to a sensing current supply portion so that a sensing current for detecting a change in magnetoresistance flows in through one end of said series connection body, passes in turn through effective areas effective in changing magnetoresistance in each of said magnetoresistive effect element portions so as to penetrate said laminated surfaces, and flows out through the other end of said series connection body; and
wherein each of said switching elements switches on/off between said one end and said other end of said series connection body of said magnetoresistive effect element connected in parallel with said switching element, in accordance with a signal inputted into a control input portion of said switching element.

3. A memory device according to claim 2,
wherein said plurality of blocks are arrayed in a two-dimensional matrix extending in a row direction and in a column direction, while said plurality of memory cells in each of said blocks are arrayed in said column direction;
wherein said control input portions of said plurality of switching elements in said plurality of blocks are connected through a plurality of first read selection lines in respective rows so that each of said first read selection lines is shared among said control input portions in a row corresponding to said first read selection line;
wherein each of said blocks includes a selection switch connected to one of series connection ends of said plurality of memory cells in said block;
wherein the other ends of series connections of said plurality of memory cells in said plurality of blocks are connected through a plurality of read lines in respective columns so that each of said read lines is shared among said other ends in a column corresponding to said read line; and
wherein control input portions of said selection switches in said plurality of blocks are connected through a plurality of second read selection lines in respective columns so that each of said second read selection lines is shared among said control input portions in a column corresponding to said second read selection line.

4. A memory device according to claim 1, wherein each of said switching elements is a field effect transistor.

5. A memory device according to claim 1, wherein said magnetoresistive effect element portions in each of said magnetoresistive effect elements have one and the same layer structure.

6. A memory device according to claim 1, wherein in each of said magnetoresistive effect elements a direction of said sensing current flowing through said effective area of one of paired magnetoresistive effect element portions selected from said plurality of magnetoresistive effect element portions and connected electrically with each other is opposite to a direction of said sensing current flowing through said effective area of the other of said paired magnetoresistive effect element portions.

7. A memory device according to claim 1, wherein in each of said magnetoresistive effect elements, a pair of magnetoresistive effect element portions selected from said plurality of magnetoresistive effect element portions are connected electrically with each other by forming at least one of layers constituting one of said paired magnetoresistive effect element portions and a corresponding one of layers constituting the other of said paired magnetoresistive effect element portions integrally out of one and the same material.

8. A memory device according to claim 1, wherein in each of said magnetoresistive effect elements, the number of said plurality of magnetoresistive effect element portions is even.

9. A memory device according to claim 8, wherein in each of said magnetoresistive effect elements, said one end of said series connection body is a layer of one of said magnetoresistive effect element portions, which layer is on said substrate side; and
wherein in each of said magnetoresistive effect elements, said other end of said series connection body is a layer of another of said magnetoresistive effect element portions, which layer is on said substrate side.

10. A memory device according to claim 1, wherein in each of said magnetoresistive effect elements, each of said magnetoresistive effect element portions includes first and second magnetic layers.

11. A memory device according to claim 10, wherein in each of said magnetoresistive effect elements, each of said magnetoresistive effect element portions includes a tunnel barrier layer put between said first and second magnetic layers.

12. A memory device according to claim 10, wherein in each of said magnetoresistive effect elements, each of said magnetoresistive effect element portions includes an on magnetic metal layer put between said first and second magnetic layers.

13. A memory device according to claim 10, wherein in each of said magnetoresistive effect elements, at least a pair of magnetoresistive effect element portions selected from said plurality of magnetoresistive effect element portions are connected electrically with each other by forming said first magnetic layer of one of said paired magnetoresistive effect element portions and said first magnetic layer of the other of said paired magnetoresistive effect element portions integrally out of one and the same material.

14. A memory device according to claim 10, wherein in each of said magnetoresistive effect elements, at least a pair of magnetoresistive effect element portions selected from said plurality of magnetoresistive effect element portions are connected electrically with each other by forming said second magnetic layer of one of said paired magnetoresistive effect element portions and said second magnetic layer of the other of said paired magnetoresistive effect element portions integrally out of one and the same material.

15. A memory device according to claim 10, wherein in each of said magnetoresistive effect elements, said first magnetic layer of each of said magnetoresistive effect element portions is a free layer whose magnetization direction is variable in accordance with an external magnetic field, while said second magnetic layer of each of said magnetoresistive effect element portions is a pinned layer whose magnetization direction is fixed in a constant direction.

16. A memory device according to claim 15, wherein in each of said magnetoresistive effect elements, magnetization directions of said second magnetic layers of said plurality of magnetoresistive effect element portions are identical.

17. A memory device according to claim 15, wherein in each of said magnetoresistive effect elements, said first magnetic layer of each of said magnetoresistive effect element portions is disposed on the opposite side of said second magnetic layer to said substrate.

18. A memory device according to claim 1, wherein two write lines are disposed for giving a magnetic field to each of said magnetoresistive effect elements so as to change over a magnetization state of said plurality of magnetoresistive effect element portions in said magnetoresistive effect element between a first state where all the resistance values of said plurality of magnetoresistive effect element portions become relatively large and a second state where all the resistance values of said plurality of magnetoresistive effect element portions become relatively small; and wherein said magnetization state of said plurality of magnetoresistive effect element portions in said magnetoresistive effect element is changed over in a lump by a combined magnetic field generated by said two write lines.

19. A memory device according to claim 17, wherein two write lines are disposed for giving a magnetic field to each of said magnetoresistive effect elements so as to change over a magnetization state of said plurality of magnetoresistive effect element portions in said magnetoresistive effect element between a first state where all the resistance values of said plurality of magnetoresistive effect element portions become relatively large and a second state where all the resistance values of said plurality of magnetoresistive effect element portions become relatively small;

wherein said magnetization state of said plurality of magnetoresistive effect element portions in said magnetoresistive effect element is changed over in a lump by a combined magnetic field generated by said two write lines; and wherein a magnetic circuit forming layer is provided in said magnetoresistive effect element for guiding said magnetic field generated by said two write lines into said free layers.

20. A memory device according to claim 19, wherein said two write lines disposed for each of said magnetoresistive effect elements extend in different directions from each other and in parallel with said laminated surfaces so as to cross each other;

wherein said magnetic circuit forming layer provided for each of said magnetoresistive effect elements guides said combined magnetic field generated by said two write lines disposed for said magnetoresistive effect element, into said free layers of said magnetoresistive effect element in the vicinities of four corners of a crossing portion of said two write lines.

21. A memory device according to claim 18, wherein said two write lines disposed for each of said magnetoresistive effect elements are electrically insulated from each other.

22. A memory device according to claim 18, wherein said two write lines disposed for each of said magnetoresistive effect elements are disposed on the opposite side of said magnetoresistive effect element to said substrate.

23. A magnetoresistive effect element comprising:
a plurality of magnetoresistive effect element portions laminated on one surface side of a substrate and disposed in a direction parallel to laminated surfaces of said magnetoresistive effect element portions with respect to one another;

wherein said magnetoresistive effect element portions are electrically connected in series so as to form an electric series connection body; and wherein opposite ends of said series connection body are electrically connected to a sensing current supply portion so that a sensing current for detecting a change in magnetoresistance flows in through one end of said series connection body, passes in turn through effective areas effective in changing magnetoresistance in each of said magnetoresistive effect element portions so as to penetrate said laminated surfaces, and flows out through the other end of said series connection body.

24. A magnetoresistive effect element according to claim 23, wherein said magnetoresistive effect element portions have one and the same layer structure.

25. A magnetoresistive effect element according to claim 23, wherein a direction of said sensing current flowing through said effective area of one of paired magnetoresistive effect element portions which are selected from said plurality of magnetoresistive effect element portions and which are connected electrically with each other is opposite to a direction of said sensing current flowing through said effective area of the other of said paired magnetoresistive effect elements portions.

26. A magnetoresistive effect element according to claim 23, wherein a pair of magnetoresistive effect element portions selected from said plurality of magnetoresistive effect element portions are connected electrically with each other by forming at least one of layers constituting one of said paired magnetoresistive effect element portions and a corresponding one of layers constituting the other of said paired magnetoresistive effect element portions integrally out of one and the same material.

27. A magnetoresistive effect element according to claim 23, wherein the number of said plurality of magnetoresistive effect element portions is even.

28. A magnetoresistive effect element according to claim 27, wherein said one end of said series connection body is a layer of one of said magnetoresistive effect element portions, which layer is on said substrate side; and wherein said other end of said series connection body is a layer of another of said magnetoresistive effect element portions, which layer is on said substrate side.

29. A magnetoresistive effect element according to claim 23, wherein each of said magnetoresistive effect element portions includes first and second magnetic layers.

30. A magnetoresistive effect element according to claim 29, wherein each of said magnetoresistive effect element portions includes a tunnel barrier layer put between said first and second magnetic layers.

31. A magnetoresistive effect element according to claim 29, wherein each of said magnetoresistive effect element portions includes a non-magnetic metal layer put between said first and second magnetic layers.

32. A magnetoresistive effect element according to claim 29, wherein at least a pair of magnetoresistive effect element portions selected from said plurality of magnetoresistive effect element portions are connected electrically with each other by forming said first magnetic layer of one of said paired magnetoresistive effect element portions and said first magnetic layer of the other of said paired magnetoresistive effect element portions integrally out of one and the same material.

33. A magnetoresistive effect element according to claim 29, wherein at least a pair of magnetoresistive effect element portions selected from said plurality of magnetoresistive effect element portions are connected electrically with each other by forming said second magnetic layer of one of said paired magnetoresistive effect element portions and said second magnetic layer of the other of said paired magnetoresistive effect element portions integrally out of one and the same material.

34. A magnetoresistive effect element according to claim 29, wherein said first magnetic layer of each of said magnetoresistive effect element portions is a free layer whose magnetization direction is variable in accordance with an external magnetic field, while said second magnetic layer of each of said magnetoresistive effect element portions is a pinned layer whose magnetization direction is fixed in a constant direction.

35. A magnetoresistive effect element according to claim 34, wherein magnetization directions of said second magnetic layers of said plurality of magnetoresistive effect element portions are identical.

36. A magnetoresistive effect element according to claim 34, wherein said first magnetic layer in each of said magnetoresistive effect element portions is disposed on the opposite side of said second magnetic layer to said substrate.

37. A magnetoresistive effect element according to claim 34, wherein said first magnetic layer of each of said magnetoresistive effect element portions is made from a soft magnetic material.

38. A memory device comprising a memory cell for storing data, said memory cell including a magnetoresistive effect element according to claim 23.

39. A memory device according to claim 38, further comprising one or more write lines for providing a magnetic field for changing over a magnetization state of said plurality of magnetoresistive effect element portions in said magnetoresistive effect element between a first state where all the resistance values of said plurality of magnetoresistive effect element portions become relatively large and a second state where all the resistance values of said plurality of magnetoresistive effect element portions become relatively small.

40. A memory device according to claim 39, wherein the lumber of said one or more write lines is two; and
wherein said magnetization state of said plurality of magnetoresistive effect element portions in said magnetoresistive effect element is changed over in a lump by a combined magnetic field generated by said two write lines.

41. A memory device comprising:
a memory cell for storing data, said memory cell including a magnetoresistive effect element according to claim 36;
one or more write lines for providing a magnetic field for changing over a magnetization state of said plurality of magnetoresistive effect element portions in said magnetoresistive effect element between a first state where all the resistance values of said plurality of magnetoresistive effect element portions become relatively large and a second state where all the resistance values of said plurality of magnetoresistive effect element portions become relatively small; and
a magnetic circuit forming layer for guiding said magnetic field generated by said one or more write lines, into said free layers.

42. A memory device according to claim 41, wherein the number of said one or more write lines is two;
wherein said magnetization state of said plurality of magnetoresistive effect element portions in said magnetoresistive effect element is changed over in a lump by a combined magnetic field generated by said two write lines;
wherein said two write lines extend in different directions from each other and in parallel with said laminated surfaces so as to cross each other; and
wherein said magnetic circuit forming layer guides said combined magnetic field generated by said two write lines, into said free layers in the vicinities of four corners of a crossing portion of said two write lines.

43. A memory device according to claim 39, wherein said one or more write lines are electrically insulated from one another.

44. A memory device according to claim 39, wherein said one or more write lines are disposed on the opposite side of said magnetoresistive effect element to said substrate.

* * * * *